(12) United States Patent
Kawanishi et al.

(10) Patent No.: US 7,756,181 B2
(45) Date of Patent: Jul. 13, 2010

(54) SEMICONDUCTOR LASER DEVICE, OPTICAL TRANSMISSION DEVICE, OPTICAL TRANSMISSION SYSTEM, ELECTRONIC DEVICE, CONTROL DEVICE, CONNECTOR, COMMUNICATION DEVICE, AND OPTICAL TRANSMISSION METHOD AND DATA TRANSMISSION AND RECEPTION METHOD

(75) Inventors: Hidenori Kawanishi, Nara (JP); Toshihiro Inooka, Nara (JP); Atsushi Shimonaka, Nara (JP); Keiji Kumatani, Hashimoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 500 days.

(21) Appl. No.: 11/086,346

(22) Filed: Mar. 23, 2005

(65) Prior Publication Data

US 2005/0163177 A1 Jul. 28, 2005

Related U.S. Application Data

(62) Division of application No. 09/667,775, filed on Sep. 22, 2000, now Pat. No. 6,888,864.

(30) Foreign Application Priority Data

| Sep. 24, 1999 | (JP) | ................................. 11-271455 |
| Sep. 19, 2000 | (JP) | ............................. 2000-284426 |

(51) Int. Cl.
  *H01S 5/02* (2006.01)
  *H01L 27/15* (2006.01)
(52) U.S. Cl. .............................. 372/50.121; 372/50.12; 372/50.122; 372/50.21; 398/67; 398/69
(58) Field of Classification Search .................. 389/41; 372/50.12–50.122; 398/69, 67
See application file for complete search history.

(56) References Cited

U.S. PATENT DOCUMENTS

| 3,614,550 | A |   | 10/1971 | Marinace et al. |
| 4,829,531 | A |   | 5/1989 | Kawanishi et al. |
| 4,873,681 | A | * | 10/1989 | Arthurs et al. ................. 398/51 |
| 4,889,404 | A | * | 12/1989 | Bhagavatula et al. .......... 398/79 |
| 5,012,478 | A |   | 4/1991 | Hattori et al. |
| 5,177,753 | A |   | 1/1993 | Tanaka |

(Continued)

FOREIGN PATENT DOCUMENTS

JP    407072311 A    3/1995

(Continued)

OTHER PUBLICATIONS

Claisse, P.R. et al., "Internal Quantum Efficiency of Laser Diodes," Electronics Letters, vol. 28, No. 21, pp. 1991-1992 (1992).

(Continued)

*Primary Examiner*—Minsun Harvey
*Assistant Examiner*—Michael Carter
(74) *Attorney, Agent, or Firm*—Birch, Stewart, Kolasch & Birch, LLP

(57) ABSTRACT

A device including a semiconductor laser device having a semiconductor laser chip, and a molded resin having a light diffusion capability. The semiconductor laser chip is covered with the molded resin.

10 Claims, 20 Drawing Sheets

U.S. PATENT DOCUMENTS

| | | | |
|---|---|---|---|
| 5,278,687 A * | 1/1994 | Jannson et al. | 398/79 |
| 5,305,133 A * | 4/1994 | Cooper et al. | 398/42 |
| 5,355,385 A | 10/1994 | Amano et al. | |
| 5,357,536 A | 10/1994 | Andrews | |
| 5,384,651 A * | 1/1995 | Van de Voorde et al. | 398/185 |
| 5,386,428 A | 1/1995 | Thornton et al. | |
| 5,422,905 A | 6/1995 | Andrews | |
| 5,488,678 A | 1/1996 | Taneya et al. | |
| 5,542,018 A * | 7/1996 | Kuhara et al. | 385/92 |
| 5,557,116 A * | 9/1996 | Masui et al. | 257/100 |
| 5,625,402 A | 4/1997 | Sarraf | |
| 5,627,554 A * | 5/1997 | Jefferson | 345/5 |
| 5,748,390 A * | 5/1998 | Koiwai et al. | 359/811 |
| 5,808,767 A * | 9/1998 | Williams et al. | 398/70 |
| 5,825,952 A | 10/1998 | Kawanishi et al. | |
| 5,838,703 A * | 11/1998 | Lebby et al. | 372/50.21 |
| 5,850,408 A * | 12/1998 | Ouchi et al. | 372/27 |
| 5,907,571 A | 5/1999 | Ogino et al. | |
| 5,910,851 A * | 6/1999 | Flaherty | 398/36 |
| 5,970,081 A | 10/1999 | Hirayama et al. | |
| 5,976,175 A | 11/1999 | Hirano et al. | |
| 5,993,075 A * | 11/1999 | Huang et al. | 385/92 |
| 5,999,552 A * | 12/1999 | Bogner et al. | 372/43.01 |
| 6,038,243 A * | 3/2000 | Mogi | 372/50.121 |
| 6,049,125 A | 4/2000 | Brooks et al. | |
| 6,393,184 B1 * | 5/2002 | Day et al. | 385/49 |
| 6,842,472 B1 | 1/2005 | Shimonaka | |
| 6,865,207 B1 | 3/2005 | Kawanishi | |

FOREIGN PATENT DOCUMENTS

| | | |
|---|---|---|
| JP | 2511591 | 4/1996 |

OTHER PUBLICATIONS

Missagia, L.J. et al., "Microchannel Heat Sinks for Two-Dimensional High-Power-Density Diode Laser Arrays," IEEE J. Quantum Electronics, vol. 25(9), Sep. 1989, pp. 1988-1992.

Hazell, J.F. et al., "The Effect of Varying Barrier Height on the Operational Characteristics of 1.3 micron Strained-Layer MQW Lasers," IEEE J. Quantum Electronics, vol. 34(12), Dec. 1998, pp. 2358-2363.

Kudo, K. et al., "1.52-1.59 micron Range Different-Wavelength Modulator-Integrated DBF-LDs Fabricated on a Single Wafer," in "Integrated Optics and Optical Fibre Communications" (Int. Conf. on -), Sep. 22-25, 1997 Edinburgh, UK (vol. 5, pp. 49-52).

W. Koechner, "Solid-State Laser Engineering," Springer Series in Optical Sciences, vol. 1, Springer Verlag, New York, Heidelberg, Berlin 1976 (ISBN: 0-387-90167-1) (1976), particularly: pp. 246 and 277.

* cited by examiner

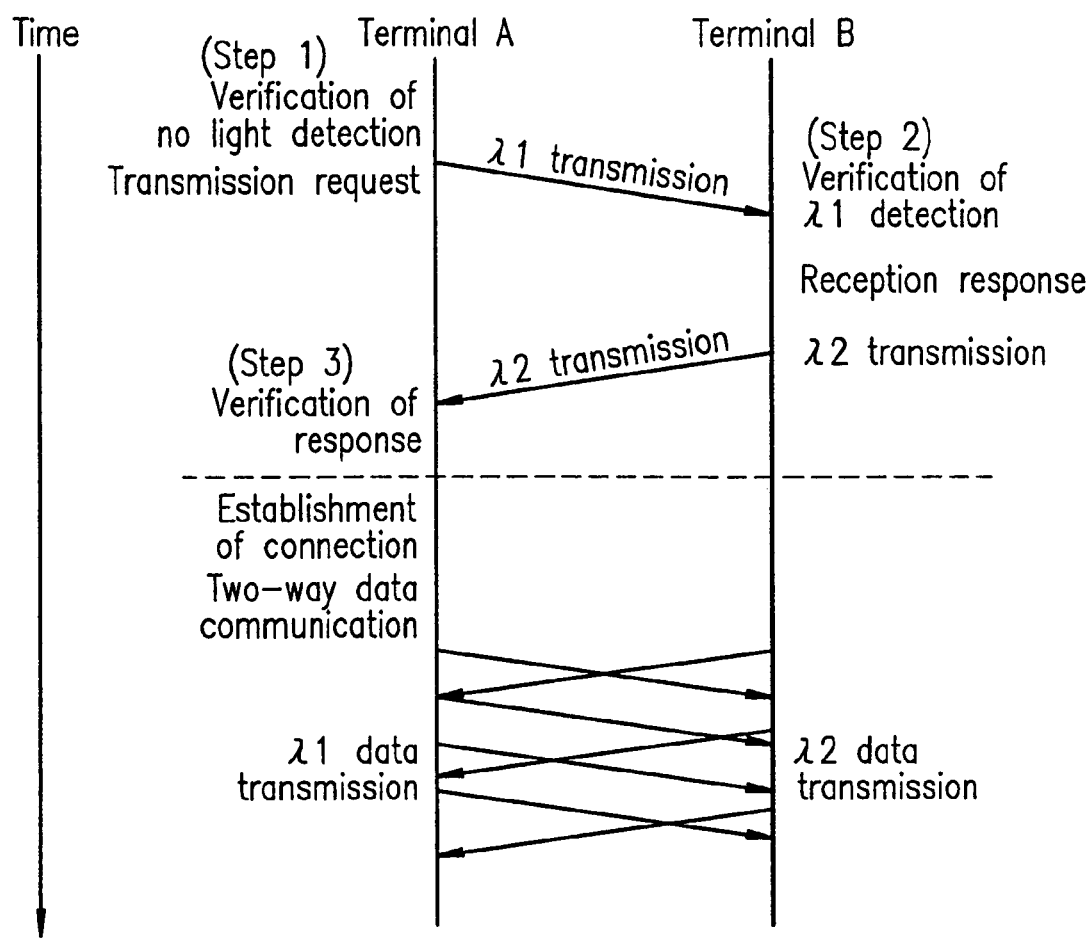

SEMICONDUCTOR LASER DEVICE, OPTICAL TRANSMISSION DEVICE, OPTICAL TRANSMISSION SYSTEM, ELECTRONIC DEVICE, CONTROL DEVICE, CONNECTOR, COMMUNICATION DEVICE, AND OPTICAL TRANSMISSION METHOD AND DATA TRANSMISSION AND RECEPTION METHOD

This application is a Divisional of application Ser. No. 09/667,775, filed on Sep. 22, 2000 now U.S. Pat. No. 6,888,864, and for which priority is claimed under 35 U.S.C. §120; and this application claims priority of Application No. 11-271455 filed in Japan on Sep. 24, 1999 and Application No. 2000-284426 filed in Japan on Sep. 19, 2000 under 35 U.S.C. §119; the entire contents of all are hereby incorporated by reference.

BACKGROUND OF THE INVENTION

1. Field of the Invention

The present invention relates to a semiconductor laser device which is used in applications, such as a light source for wireless communication and sensing, where the device emits a light beam into a space and a human may see the light beam directly from its light source, and which ensures the safety of eyes. The present invention also relates to an optical transmission device and an optical transmission system using the above-described semiconductor laser device. The present invention still further relates to an electronic device, a control device, and a communication device using the above-described optical transmission device or optical transmission system, such as a personal computer, a personal digital assistant, or a digital camera. The present invention further relates to a space optical transmission method and a data transmission and reception method. Moreover, the present invention is directed to a semiconductor laser device emitting a light beam having an enlarged spot; an optical transmission device and an optical transmission system capable of simultaneous transmission and reception; an electronic device and a fiber optical transmission system, a control device, and a communication device using a fiber optical transmission system for multi-channel cable television (CATV) or audio-visual (AV) equipment; and a fiber optical transmission method and a data transmission and reception method.

2. Description of the Related Art

At present, space optical transmission using infrared light is widely used owing to standardization and popularization by the Infrared Data Association (IrDA) For example, FIG. 15 shows an example of the space optical transmission with which data is transferred between a personal computer 1500 and a personal digital assistant 1502. Using infrared light 1501, data such as addresses or schedules can be transferred over distances of up to about 1 m.

Recently, the transmission speed is ever growing with an increase in data capacity, changing from 1 Mbps to 4 Mbps, and further to 16 Mbps. There is also a growing demand for an increase in transmission distance. The transmission at distances of up to about 8 m is possible in the IrDA control standard. In this case, the transmission speed is limited to about 75 Kbps. Further, there is an effort to transmit image information on wireless communication.

Significant progress has been made in optical transmission technology using a fiber transmission path such as an optical fiber. In particular, plastic optical fibers are rapidly becoming widespread because of their low cost and large fiber diameters. The large fiber diameter makes it easy to couple with a light emitting element, as compared with a single mode fiber. In the optical transmission technology using the POF, 100 Mbps or more is presently established using a semiconductor laser.

At present, light emitting diodes (LED) are used as light sources in the space optical transmission. Now commercially available LEDs are not suitable for higher speed and longer distance transmission in view of the following two points:

(1) high-speed modulation is impossible due to the limitations of high-speed response characteristics of the LED; and (2) power consumption is enormous in long distance transmission.

As to the problem (1), the limit of a modulated frequency of typical LEDs is about 50 MHz. It is difficult to obtain a modulated frequency higher than about 50 MHz. Moreover, special LEDs capable of high-speed modulation dissipate very high power. As to the problem (2), for example, assuming that data is transmitted over a distance of 5 m at 40 Mbps, an LED alone dissipates as much as 1 W of power.

In contrast, semiconductor laser devices are capable of high-speed modulation. Further, the semiconductor laser devices require lower power consumption to obtain the same light beam output as compared with the LEDs. However, the semiconductor laser light beam itself exceeds a safety level of eyes, so that it is not allowable to emit the semiconductor laser light beam directly into a space. Moreover, the reliability of the semiconductor laser devices may be deteriorated during the high-output operation.

Furthermore, the space optical transmission system is not capable of full-duplex transmission. This is a serious problem. The problem will then be described below.

The electronic devices such as the personal computer 1500 and the personal digital assistant 1502 shown in FIG. 15 include a transmission and reception unit including a set of a transmission unit having an LED and a reception unit having a light receiving element. An electronic device communicates via a set of a transmission unit and a reception unit of another electronic device which may be the party on the either end of the communication. FIG. 16 shows an example of a transmission and reception unit 1600 into which a set of a transmission unit 1601 and a reception unit 1602 are integrated. This is an attempt to realize small-size and low-cost IrDA parts. Each unit is covered with a molded resin. Particularly, a resin material which does not transmit visible light is used for the reception unit 1602 in order not to be affected by noise due to background light. A typical LED has a wavelength band of 850-900 nm. Therefore, if visible light is blocked in the above-described manner, the background light noise can be reduced.

In the transmission and reception unit 1600, the transmission unit 1601 emits a transmitted light beam 1603 having a directivity angle of about 30°. The transmitted light beam 1603 travels to a reception unit (not shown) of the party on the other end of communication (hereinafter referred to as the "other party"), its intensity being attenuated inversely with the second power of the distance. Part of the transmitted light beam 1603 also reaches the reception unit 1602 adjacent to the transmission unit 1601 and is received by a light receiving element in the reception unit 1602. The amount of light detected by the reception unit 1602 is small. Nevertheless, the intensity of such light is typically greater than or equal to that of a signal light beam from the other party, since the signal light beam is attenuated during transmission. Accordingly, when two-way communication is tested using two transmission and reception units, full-duplex communication cannot be attained. In this case, no more than half-duplex communication is performed, so that the effective transmission speed is greatly reduced.

Next, problems with the fiber optical transmission system will be described.

FIG. 17 shows an example of a transmission and reception unit 1700 at one end of the fiber optical transmission system using the POF. The transmission and reception unit 1700 includes a semiconductor laser chip 1715 in one package and a light receiving element 1705 in another package which are coupled with the POF 1716 and the POF 1717, respectively. The POF 1716 and the POF 1717 are fusion spliced into a single fiber 1718 reaching to the other party. In the optical transmission system, the transmission and reception unit at the other party employs a semiconductor laser chip and a light receiving element having the same characteristics as that of the transmission and reception unit 1700. The optical transmission system performs the half-duplex communication where one transmission and reception unit performs only transmission while the other transmission and reception unit performs only reception.

The semiconductor laser chip 1701 emits a light beam having a very small spot of several micrometers. The POF 1716 has a large diameter. Therefore, the alignment of the semiconductor laser chip 1701 and the POF 1716 is easier as compared with the single mode fiber. It is not as easy as the alignment of the LED and the POF. In the case of the full-duplex communication, two POFs are required and the two POFs must be fully separated. It is not possible to establish the full-duplex communication using a single fiber.

SUMMARY OF THE INVENTION

According to one aspect of the present invention, a semiconductor laser device includes a semiconductor laser chip; and a molded resin having a light diffusion capability. The semiconductor laser chip is covered with the molded resin.

In one embodiment of this invention, the semiconductor laser chip does not directly contact the molded resin.

In one embodiment of this invention, the semiconductor laser device further includes a light diffusion plate provided between the semiconductor laser chip and the molded resin.

In one embodiment of this invention, the semiconductor laser chip includes a plurality of light emitting portions.

In one embodiment of this invention, the semiconductor laser chip includes at least one light emitting portion having a width of about 7 µm or more.

In one embodiment of this invention, a semiconductor laser device further includes at least one additional semiconductor laser chip.

In one embodiment of this invention, the spot size and radiation angle of an emitted light beam can be controlled by adjusting the intervals between each light emitting portion of the semiconductor laser chip including a plurality of light emitting portions, and the size, material, and shape of the molded resin.

In one embodiment of this invention, the spot size and radiation angle of an emitted light beam can be controlled by adjusting the width of the light emitting portion of the semiconductor laser chip including the light emitting portion having a width of about 7 µm or more, and the size, material, and dimension of the molded resin.

In one embodiment of this invention, the spot size and radiation angle of an emitted light beam are controlled by adjusting the intervals between the semiconductor laser chips, and the size, material, and dimension of the molded resin.

In one embodiment of this invention, materials having different refractive indexes are mixed into the molded resin.

In one embodiment of this invention, the materials include a transparent epoxy resin and a silica resin.

In one embodiment of this invention, a semiconductor laser device further includes a container for containing the semiconductor laser device. The thermal resistance of the container is about 150 deg/W or less.

In one embodiment of this invention, the thermal resistance of the container is about 100 deg/W or less.

In one embodiment of this invention, the plurality of light emitting portions of the semiconductor laser chip emit light beams having the same wavelength.

In one embodiment of this invention, the semiconductor laser chips emit light beams having the same wavelength.

In one embodiment of this invention, at least two of the plurality of light emitting portions of the semiconductor laser chip emit light beams having different wavelengths.

In one embodiment of this invention, at least two of the semiconductor laser chips emit light beams having different wavelengths.

In one embodiment of this invention, the wavelength of a light beam emitted by the semiconductor laser chip is selected from a wavelength band of about 760 nm or more to about 1.5 µm or less.

In one embodiment of this invention, the wavelength of a light beam emitted by the semiconductor laser chip is selected from the vicinity of any of about 900 nm, about 1.1 µm, and about 1.4 µm.

In one embodiment of this invention, the semiconductor laser chips are arranged in parallel.

According to another aspect of the present invention, an optical transmission device in which the above-described semiconductor laser device is used as a light source is provided.

In one embodiment of this invention, a light beam is transmitted via a space, or a light beam is transmitted via an optical fiber as a transmission path.

According to another aspect of the present invention, an optical transmission device includes a light emitting element capable of emitting light beams having different wavelengths; and a light receiving element capable of selectively receiving the light beams having different wavelengths. The above-described semiconductor laser device is used as the light emitting element.

According to another aspect of the present invention, an optical transmission device includes a light emitting element capable of emitting light beams having different wavelengths; and a first light receiving element capable of selectively receiving the light beams having different wavelengths. Transmission of the light emitting element and reception of the first light receiving element are simultaneously performed.

In one embodiment of this invention, the wavelength of a light beam received by the first light receiving element is determined, and the light emitting element emits a light beam having a wavelength other than the wavelength of the light beam received by the first light receiving element.

In one embodiment of this invention, the optical transmission device further includes a second light receiving element capable of selectively receiving the light beams having different wavelengths. The first light receiving element is covered with a first molded resin, and the second light receiving element is covered with a second molded resin; and the range of the wavelength of a light beam transmitting through the first molded resin does not overlap the range of the wavelength of a light beam transmitting through the second molded resin.

In one embodiment of this invention, the optical transmission device further includes a second light receiving element capable of selectively receiving the light beams having different wavelengths. A first wavelength filter is provided on the first light receiving element, and a second wavelength filter is provided on the second light receiving element; and the range of the wavelength of a light beam transmitting through the first molded resin does not overlap the range of the wavelength of a light beam transmitting through the second molded resin.

In one embodiment of this invention, the range of the wavelength of a light beam transmitting through the first wavelength filter is greater than or equal to a specific wavelength, and the range of the wavelength of a light beam transmitting through the second wavelength filter is less than or equal to the specific wavelength.

In one embodiment of this invention, at least one of the wavelength filters is a band pass filter.

In one embodiment of this invention, the light emitting element includes a plurality of semiconductor laser chips.

In one embodiment of this invention, the light emitting element includes a multi-wavelength laser element.

In one embodiment of this invention, the plurality of wavelengths of light beams emitted by the light emitting element correspond to the plurality of wavelengths of light beams which are received by the first light receiving element.

In one embodiment of this invention, the optical transmission device further includes a second light receiving element capable of selectively receiving the light beams having different wavelengths. The wavelength range of the photosensitivity of the first light receiving element does not overlap the wavelength range of the photosensitivity of the second light receiving element.

In one embodiment of this invention, the wavelength range of the photosensitivity of the first light receiving element is greater than or equal to a specific wavelength, and the wavelength range of the photosensitivity of the second light receiving element is less than or equal to the specific wavelength.

According to another aspect of the present invention, an optical transmission system includes a plurality of any one of the above-described optical transmission devices.

In one embodiment of this invention, among the plurality of optical transmission devices, a light beam is transmitted via a space, or a light beam is transmitted via an optical fiber as a transmission path.

In one embodiment of this invention, among the plurality of optical transmission devices, a light beam is transmitted via a space, or a light beam is transmitted via an optical fiber as a transmission path.

According to another aspect of the present invention, an electronic device includes the above-described semiconductor laser device.

According to another aspect of the present invention, an electronic device includes any one of the above-described optical transmission devices.

According to another aspect of the present invention, a control device includes a light detection section for receiving an output of a light receiving section receiving a light beam, and detecting a light reception state of the light receiving section; a determination section for determining whether the light receiving section is ready to receive the light beam based on an output of the light detection section; a demodulation section for demodulating the light beam to obtain received data, when the light receiving section is ready to receive the light beam; and a selection section for automatically selecting a wavelength different from the wavelength of the light beam and outputting information on the selected wavelength to a light emitting section.

In one embodiment of this invention, the determination section includes a reception detection select circuit for controlling the light receiving section so that the light receiving section does not receive a light beam emitted by the light emitting section.

According to another aspect of the present invention, a communication device includes a light emitting element capable of emitting light beams having a plurality of different wavelengths; a light receiving element capable of selectively receiving the light beam having each wavelength; and the above-described control device. A semiconductor laser device including a semiconductor chip, and a molded resin for covering the semiconductor laser chip, having a light diffusion capability is used as the light emitting element.

In one embodiment of this invention, the determination section includes a reception detection select circuit for controlling the light receiving section so that the light receiving section does not receive a light beam emitted by the light emitting section.

In one embodiment of this invention, the control device has a protocol in which the control device controls the light emitting element so that the light emitting element transmits a light beam having a wavelength different from a wavelength detected by the light receiving element; connection is established after verifying that the wavelength of a light beam emitted by the light emitting element is different from the wavelength of a light beam received by the light receiving element.

In one embodiment of this invention, the control device has a protocol in which the control device sets a random waiting time to avoid collision of connection establishments when the light emitting element emits a light beam having a wavelength and thereafter the light receiving element receives a light beam having the wavelength.

According to another aspect of the present invention, a connector includes a cylinder having opposite ends; a light receiving element provided inside the cylinder, for selectively receiving light beams having a plurality of different wavelengths.

In one embodiment of this invention, the light receiving element is provided on an inner surface of a wall of the cylinder.

According to another aspect of the present invention, an optical transmission method is provided for transmitting and receiving a light beam using an optical transmission device including a light emitting element capable of emitting light beams having a plurality of different wavelengths and a light receiving element capable of selectively receiving a light beam having each wavelength. The method includes the steps of automatically determining a wavelength of a light beam received by the light receiving element among light beams having the plurality of wavelengths which the light receiving element can receive; and selecting a light beam having a wavelength different from the wavelength of a light beam received by the light receiving element and transmitting the selected light beam.

According to another aspect of the present invention, a data transmission and reception method includes the steps of emitting a light beam having a first wavelength as a transmission request signal to a second terminal, using a first terminal; verifying the transmission request signal using the second terminal when the second terminal receives the light beam having the first wavelength; emitting a light beam having a second wavelength as a reception response signal to the first terminal, using the second terminal; verifying the reception response signal using the first terminal when the first terminal receives the light beam having the second wavelength. Based on the verifying the reception response signal, the first terminal and the second terminal simultaneously perform transmission and reception using the light beam having the first wavelength and the light beam having the second wavelength.

In one embodiment of this invention, at least one of the first and second terminals is adapted not to detect a light beam having a wavelength emitted by the at least one of the first and second terminals for a predetermined period of time.

In one embodiment of this invention, the predetermined period of time is randomly changed.

Hereinafter, functions of the present invention will be described.

In the present invention, the semiconductor laser chip and the molded resin having a light diffusion capability are combined so that a light beam emitted from the semiconductor laser chip is safely released into a space after being diffused by the molded resin, thereby making it possible to achieve high-speed transmission with low power consumption as compared with LEDs.

The use of the multi-stripe semiconductor laser having a plurality of light emitting portions (so-called semiconductor laser array) reduces the resistance of the element, leading to a reduction in driving voltage, and further reduces a light density at the light emitting facet of the semiconductor laser chip, thereby improving the reliability of the semiconductor laser device. A similar effect applies to when the broad stripe semiconductor laser including a light emitting portion having a width of about 7 μm or more. Alternatively, when a plurality of semiconductor laser chips are used, the resistance of the element is reduced, leading to a reduction in driving voltage. Further, in this case, the load of light output is shared by the plurality of semiconductor laser chips, thereby improving the reliability of the element.

The desired spot size and radiation angle of emitted light can be obtained by adjusting the intervals between the plurality of light emitting portions of such a semiconductor laser chip; the width of the light emitting portion of the semiconductor laser chip (to 7 μm or more); and the intervals between the plurality of semiconductor laser chips; the size of the molded resin through which light is transmitted; the materials (the amounts of the light diffusion materials) and shape of the molded resin.

When materials having different refractive indexes are mixed into the molded resin, a light diffusion capability is given to the molded resin. If the molded resin is provided not to contact the semiconductor laser chip, substantially no distortion is applied to the semiconductor laser chip in forming the molded resin, thereby improving the reliability. In particular, the thermal resistance of the container including the semiconductor laser chip is preferably about 150 deg/W or less, more preferably 100 deg/W or less.

When a plurality of light emitting portions of the semiconductor laser chip, or a plurality of semiconductor laser chips emit a light beam having the same wavelength band, the reliability of the semiconductor laser device can be improved. Further, when at least two of a plurality of light emitting portions of the semiconductor laser chip, or at least two of a plurality of semiconductor laser chips emit light beams having different wavelength bands, the full-duplex communication can be performed, as described later.

In particular, when a light beam having a wavelength band of about 760 nm or more and about 1.5 μm or less, a extremely high level of reliability can be obtained as compared with any other wavelength band. Satisfactory optical transmission is obtained with the least noise if the wavelength band is in the vicinity of about 900 nm, about 1.1 μm, or about 1.4 μm.

When the semiconductor laser device of the present invention is used as a light source, light can be transmitted via a space at high speed with low power consumption as compared with when an LED is used. Moreover, light is diffused by the resin portion so that the safety of eyes is secured. A space optical transmission device, such as a transmission unit or a transmission and reception unit, whose reliability is satisfactory can also be realized. Furthermore, when the semiconductor laser device of the present invention is used as a light source, light can be transmitted via an optical fiber as a transmission path, at high speed with low power consumption. Moreover, a fiber optical transmission device, in which the light spot diameter is appropriately enlarged so that the light spot can be easily connected to the optical fiber and therefore the reliability is satisfactory, can also be realized. Therefore, high-speed data transfer can be realized with low power consumption by a personal computer, a personal digital assistant, an electronic device such as a digital camera, or the like when the semiconductor laser device or optical transmission device of the present invention is incorporated therein. Still further, the spot diameter and radiation angle can be set to an appropriate range. Therefore, the semiconductor laser device of the present invention can be used as a light source for a sensor.

When the above-described semiconductor laser is used as a light emitting element, a plurality of light beams having different wavelengths can be separately emitted. In addition, when a light receiving element capable of selectively receiving the light beams having different wavelengths is included in the semiconductor laser, an optical transmission system can be achieved in which the full-duplex communication can be performed between a plurality of transmission and reception units. For example, when one transmission and reception unit is placed opposing another one, light is transmitted and received via a space, thereby making it possible to perform the full-duplex communication. The semiconductor laser device may include a combination of a semiconductor laser chip and a molded resin as a light emitting element.

The wavelength of a light beam transmitted from the transmission and reception unit at the other party is automatically distinguished from a plurality of other light beams having different wavelengths. A wavelength other than the distinguished wavelength is selected and a light beam having such a wavelength is transmitted from the party on this side. Whereas the space optical transmission such as IrDA is conventionally half-duplex communication, the full-duplex space optical transmission can be realized in the present invention. Since the wavelength of a light beam to be used in transmission is not necessarily specified in advance, symmetrical communication can be realized without separation such as a main phone and a cordless handset. Further, when the light receiving element of the transmission and reception unit is controlled in such a way not to receive a light beam emitted by its own light emitting element, the transmission and reception unit is preferably not affected by a signal emitted by its own light emitting element. Furthermore, the present invention may be applied to an application such as a wireless IEEE1394 serial bus expected as a next-generation multi-media interface and capable of transferring a digital AV signal at high speed.

Further, conventionally, the dominating IEEE1394 full-duplex optical communication system uses two fibers. The present system can be achieved using a single fiber.

In the fiber optical transmission, the cylindrical connector is used to connect the light emitting element with the optical fiber. The light emitting element is placed at one end of the connector while the optical fiber is placed at the other end of the connector. The light receiving element is placed inside the cylindrical connector. The use of the connector makes it easier to connect the light emitting device with the fiber. Moreover, when the light receiving device is attached to the inner surface of the wall of the connector, a light beam emitted from the semiconductor laser device is not blocked by the light receiving element, thereby improving the utilization rate of a signal light beam.

The control device of the present invention includes the light detection section for detecting a reception state for each wavelength of a light beam based on the output of the light receiving element; the determination section for determining whether it is the reception ready state or not when the wavelength of the light beam emitted from the other party is determined; the demodulation section for demodulating the light beam having the wavelength determined by the determination section to obtain reception data; and the selection section for automatically selecting a wavelength different from the determined wavelength in transmitting a transmission request signal in response to the signal from the other party. Therefore, the optical transmission system, which can automatically determine the wavelength of a light beam transmitted from the other party among light beams having a plurality of different wavelengths, and selects a wavelength other than the determined wavelength, can be realized.

The communication device of the present invention selects and transmits a light beam having a wavelength different from the wavelength of a light beam emitted from the other party and detected by the light receiving element, when a transmission request is performed in response to the signal from the other party. Therefore, even when the terminal at the other party is changed, the setting of wavelength selection is not necessarily required. The communication protocol which is conventionally complicated can be simplified. Further, when the wavelength of a light beam from the other party is determined, a light beam having a wavelength different from the determined wavelength is selected, and after the difference between the transmitted light beam and the received light beam is confirmed, the connection is established. Such a protocol ensures that the wavelengths are separated and the full-duplex two-way data transmission and reception can be performed. Furthermore, when a protocol in which each party sets its own random waiting time is used, connection collision can be avoided if transmission is simultaneously performed at two parties. Therefore, it is preferable that connection can eventually be established in any situation.

Thus, the invention described herein makes possible the advantages of (1) providing a semiconductor laser device, an optical transmission device, an electronic device and a space optical transmission system, and a control device and a communication device thereof, and a space optical transmission method and a data transmission and reception method, which realize high-speed modulation, low power consumption, the safety of eyes, and high reliability, and which are suitable for the space optical transmission and realize full-duplex space optical transmission; and (2) providing a semiconductor laser device, an optical transmission device, an electronic device and a fiber optical transmission system, and a control device and a communication device thereof, and a fiber optical transmission method and a data transmission and reception method, which realize high-speed transmission, low power consumption, and easy alignment with a fiber, and which are suitable for the fiber optical transmission and realize full-duplex fiber optical transmission.

These and other advantages of the present invention will become apparent to those skilled in the art upon reading and understanding the following detailed description with reference to the accompanying figures.

BRIEF DESCRIPTION OF THE DRAWINGS

FIG. 7 is a diagram showing a connection establishment protocol when one of two terminals starts transmission.

DESCRIPTION OF THE PREFERRED EMBODIMENTS

Hereinafter, embodiments of the present invention will be described with reference to the accompanying drawings.

Embodiment 1

Figure 1:
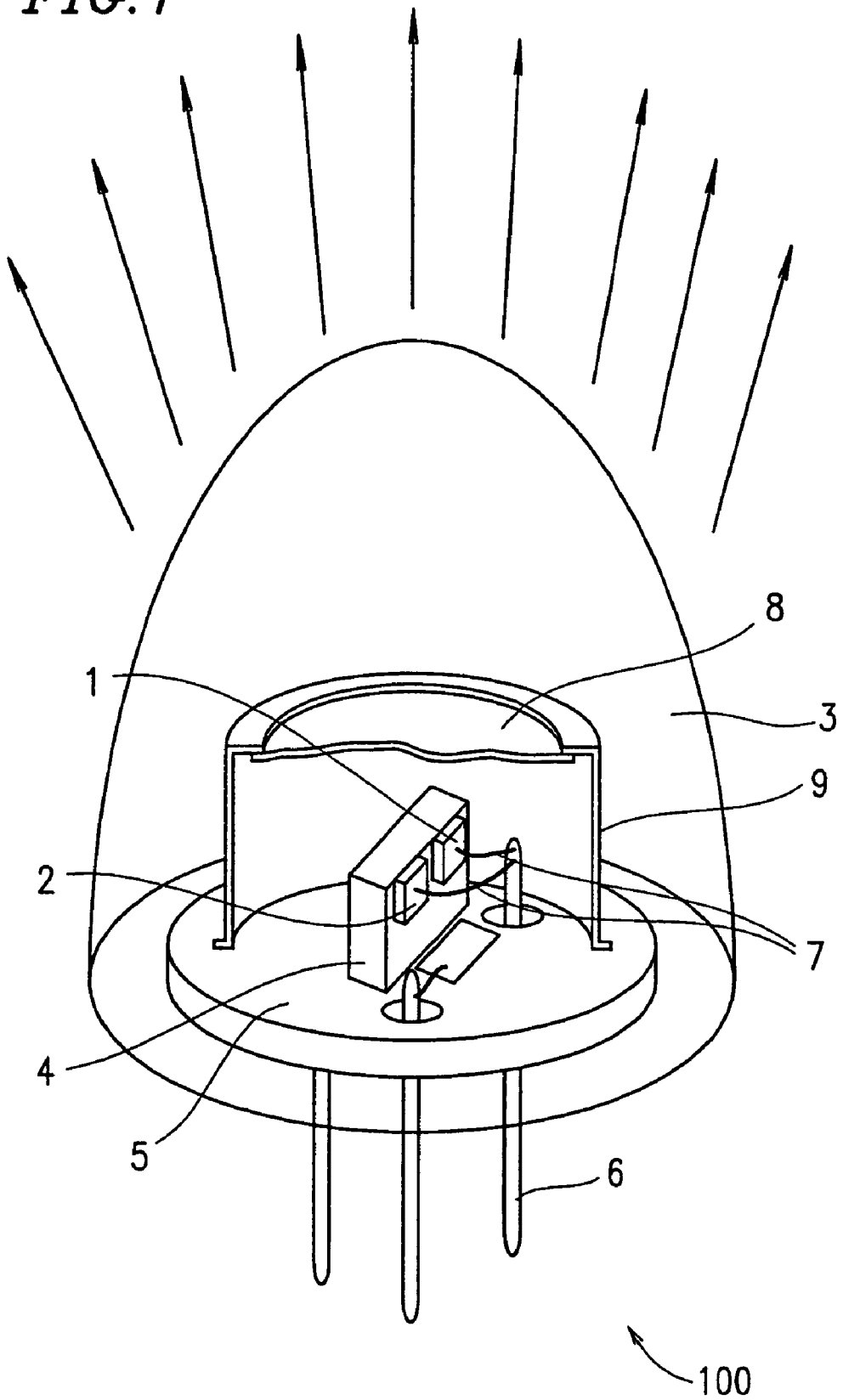
FIG. 1 is a perspective view showing a semiconductor laser device according to Embodiment 1 of the present invention.
Figure 2A:
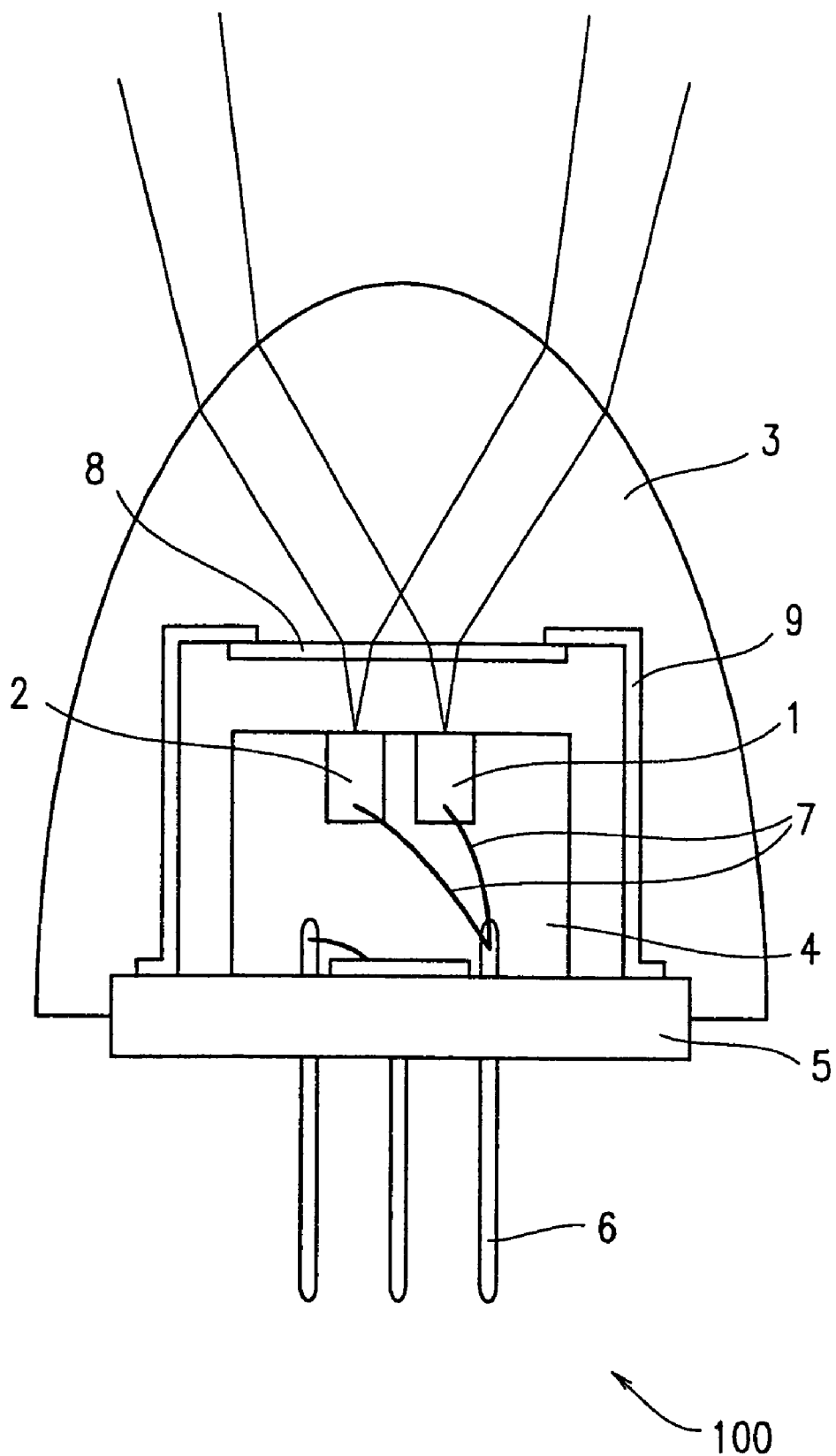
FIG. 2A is a cross-sectional view showing the semiconductor laser device of Embodiment 1.

FIG. 1 is a perspective view showing a semiconductor laser device 100 according to Embodiment 1 of the present invention. FIG. 2A is a cross-sectional view thereof. The semiconductor laser device 100 includes two semiconductor laser chips 1 and 2 which are contained in a typical semiconductor laser package. The package are entirely covered with a molded resin 3. The semiconductor laser chips 1 and 2 are fixed to a heat sink 4 which is integrally molded with a metal stem 5. The semiconductor laser chips 1 and 2 have a satisfactory heat radiation capability. In Embodiment 1, the thermal resistance of each of the packages of the semiconductor laser chips 1 and 2 is about 90 deg/W. Surfaces opposite to the heat sink 4 of the semiconductor laser chips 1 and 2 are electrically connected to each other via a common lead-pin 6 and a wire 7. Accordingly, the semiconductor laser chips 1 and 2 are connected to each other in parallel, so that a current is simultaneously supplied to the semiconductor laser chips 1 and 2 which emit a light beam in synchronization with each other.

In general, the spot sizes of light beams emitted by the semiconductor laser chips 1 and 2 are very small, i.e., several micrometers. If such a light beam is condensed by a lens or the like, the density thereof is so increased that the light beam is likely to injure a retina of an eye. For this reason, the international standard IEC60825-1 has been established for the semiconductor laser chip. When the semiconductor laser chip emits a light beam into a space, the safety is ensured if the emitted light beam is within a range regulated by the standard.

In Embodiment 1, the semiconductor laser chips 1 and 2 are covered with the molded resin 3 having an ability to diffuse light in order to attempt to enlarge the spot of a light beam emitted by the semiconductor laser chips 1 and 2. As a result, the light spot is enlarged up to about 10 mm, thereby ensuring the safety of eyes. In Embodiment 1, the light diffusion resin 3 is made of a mixture of a transparent epoxy resin and a silica resin which have different refractive indexes.

The semiconductor laser chips 1 and 2 are encapsulated by a cap 9 having a cap glass 8 before covering the semiconductor laser chips 1 and 2 with the molded resin 3. The inside of the cap 9 is filled with nitrogen gas, thereby improving the reliability of the semiconductor laser chips 1 and 2. When the semiconductor laser chips 1 and 2 are covered with the molded resin 3 without the cap 9, the semiconductor laser chips 1 and 2 are degraded in a short time. This may be because the semiconductor laser chips 1 and 2 are affected by distortion in molding the resin 3. Preferably, the semiconductor laser chips 1 and 2 do not contact the resin 3.

Figure 2B:
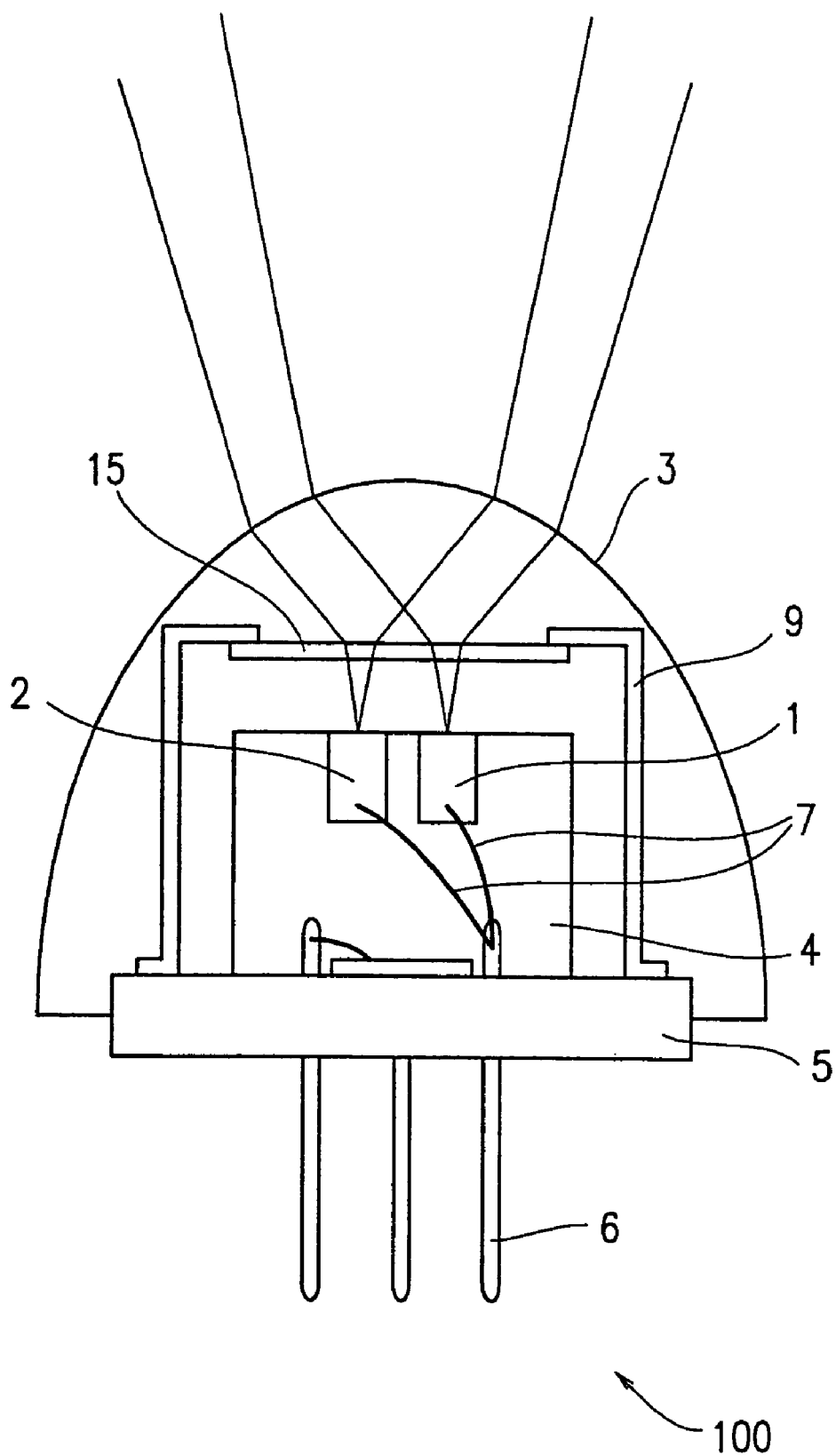
FIG. 2B is a cross-sectional view showing a variant of the semiconductor laser device of Embodiment 1.

In Embodiment 1, the spot size is enlarged by the light diffusion resin 3. Other ways having a similar effect can be used. For example, as shown in FIG. 2B, a light diffusion plate 15 may be used instead of the cap glass 8. The light diffusion plate 15 may be a ground glass obtained by roughening a surface of a glass. In this case, the diffusion effect of the resin provided on the plate may be small, so that the amount of a diffusion material such as a silica resin may be reduced. Alternatively, when light is diffused by the molded resin 3, the diffusion material may not be uniformly mixed, but more diffusion material may be distributed in one portion while less diffusion material may be distributed in another portion. The same effect can be obtained.

In order to obtain optical transmission in which data is transferred to distances of up to about 8 m at 40 Mbps using a light beam having a directivity angle of about 30°, a light output of about 350 mW is required. When such a high light output is radiated by a single element, the reliability of the semiconductor laser chip is largely reduced. In Embodiment 1, the semiconductor laser device 100 includes the two semiconductor laser chips 1 and 2. The two semiconductor laser chips 1 and 2 share the load of the light output. That is, each chip only outputs 175 mW of light output. The reliability of the semiconductor laser chip is such that the mean time to failure is inversely proportional to the second power of the level of light output, and the reliability is improved by a factor of four. Needless to say, the number of chips may be increased in order that the reliability can be further improved.

In Embodiment 1, the two semiconductor laser chips 1 and 2 emit a light beam having a wavelength band of about 980 nm. According to an experiment in which a semiconductor laser chip having a wavelength band of about 760 nm to about 1.5 µm was used, it was possible to secure a high level of reliability compared with other wavelength bands. As to how the radiation characteristics vary over time, only the element having a wavelength band of about 760 nm to about 1.5 µm had stable characteristics. Although the reason for this phenomenon is not clearly understood, it is speculated that the resin is damaged due to light in the case of other wavelength bands.

In addition, the optical transmission characteristics were studied by changing the wavelength thereof within the above-described range. The transmitted light beam had a smallest level of noise, so that satisfactory optical transmission was obtained, when the wavelength of the emitted light beam was in the vicinity of any of about 900 nm, about 1.1 µm, and about 1.4 µm. Although the reason is not clearly understood, it is speculated that the intensity of background light or an influence of sunlight is minimized in such wavelengths, particularly because a field experiment demonstrated a significant effect.

Optical transmission up to a distance of about 8 m at 40 Mbps was performed using the semiconductor laser device 100 of Embodiment 1. The power consumption of the semiconductor laser device 100 was about one third as much as that of the LED. That is, significantly low power consumption was achieved. A high-speed transmission experiment was also conducted. As a result, although the transmission distance became shorter, the transmission characteristics were stable at about 100 Mbps and also about 1 Gbps.

In Embodiment 1, the package has a thermal resistance of about 90 deg/W. In addition, several packages having different thermal resistances were subjected to an experiment in which the reliability was examined. The experiment demonstrated that an element having a thermal resistance of more than about 150 deg/W was degraded in an early period. Elements having a thermal resistance of about 150 deg/W or less exhibited stable reliability. More particularly, elements having a thermal resistance of about 100 deg/W or less exhibited extremely satisfactory reliability.

Note that some use environments do not require such a high reliability. In such cases, packages having a large thermal resistance are available. For example, an element, in which a semiconductor laser chip is mounted on a lead frame for a light emitting diode and is covered with a similar molded resin, was fabricated. Such an element exhibited a sufficient reliability in the case where the element was incorporated in a personal digital assistant and was operated for short times.

In an additional experiment, a plurality of semiconductor laser chips were connected in parallel. In this case, the resistance of the overall chips was lowered, so that the driving voltage was reduced. In Embodiment 1, a driving circuit needed a driving voltage of about 3 V or less, resulting in low power consumption.

Furthermore, in the semiconductor laser device 100 of Embodiment 1, the spot size and the radiation angle can be controlled. This will be described below.

In Embodiment 1, light beams emitted by the semiconductor laser chips 1 and 2 are diffused by the resin 3 having the ability to diffuse light. The larger the spot size of a light beam emitted from the resin 3, the longer the distance over which the light beam travels in the resin 3. From the viewpoint of the safety of eyes, the spot size is preferably as large as possible. When the distance over which the light beam travels in the resin 3 is increased in order to enlarge the spot size, the final radiation angle is inevitably enlarged. An unnecessarily large radiation angle causes an decrease in the amount of effective light. This leads to an increase in power consumption.

In contrast, as shown in FIG. 2A, in the case where a plurality of semiconductor laser chips are used, the spot size of the emitted light beam becomes larger in accordance with the distance between the positions of the light emitting points as compared with the case where a single semiconductor laser chip is used, even when the distance over which the light beam travels in the resin 3 is the same in both cases. Therefore, the size of the molded resin 3 to obtain the desired spot size can be small, resulting in a narrow radiation angle. Accordingly, in Embodiment 1, the spot size and radiation angle of the emitted light beam can be controlled by adjusting the distance between a plurality of semiconductor laser chips and the size of the molded resin.

In the case where a single semiconductor laser chip is covered with a molded resin, the setting of the radiation angle to 30° results in the spot size of the emitted light beam being about 7 mm. The setting of the radiation angle to 20° results in the spot size of the emitted light beam being about 5 mm. When a higher light output is required while keeping the same radiation angle, the spot size needs to be larger. In the case of the single semiconductor laser chip, it is impossible that only the spot size of the emitted light beam is enlarged while keeping the same radiation angle. The diffusion of light in the resin needs to be enhanced in order to enlarge the spot size of the emitted light beam. To this end, the amount of a diffusion material in the resin, such as a silica resin, needs to be increased. This however leads to an increase in radiation angle. That is, the radiation angle and the spot size cannot be separately controlled.

Consider the case where a plurality of semiconductor laser chips are used, and the resin 3 is, for example, created such that the radiation angle is about 30° and the spot size of the emitted light beam is about 7 mm. The light emitting points of two semiconductor laser chips is placed about 3 mm apart from each other. Each semiconductor laser chip emits a light beam having a spot size of about 7 mm and a radiation angle of about 30°, similar to a single semiconductor laser chip. Since the two semiconductor laser chips are placed in parallel the spot size of about 10 mm can be seen from outside the semiconductor laser device 100. As described above, when the distance between the semiconductor laser chips is increased, the spot size seen from the outside is also basically enlarged. Note that when the distance between the semiconductor laser chips 1 and 2 is too large, the light intensity distribution adversely has two peaks. Such a case should be avoided. Although the two semiconductor laser chips are placed horizontally, i.e., in parallel, the number of the semiconductor laser chips may be increased so that the intensity distribution of the emitted light beam can be corrected. Further, a plurality of semiconductor laser chips may be placed vertically, i.e., in series, by changing the design of the package.

When a narrower radiation angle is desired, the above-described adjustment may be performed while the amount of the light diffusion resin 3 is reduced. As described above, the radiation angle and spot size of the emitted light beam can be separately controlled by adjusting the number of semiconductor laser chips, the arrangement thereof, or the amounts of the light diffusion resin or the size of the molded resin, and the like.

In a situation where a narrow radiation angle can be used, the same light transmission speed and transmission distance can be obtained at lower light intensity. In this case, the reliability of the semiconductor laser chip can be greatly increased. For example, when a light beam having a radiation angle of about 20° is transmitted to a distance of about 8 m at 40 Mbps, a light output of as small as 160 mW is required. When the load of the light output is shared by two semiconductor laser chips 1 and 2, each chip only output 80 mW of light output. The reliability of the semiconductor laser chip is dramatically improved. Needless to say, the number of chips may be increased or the distance between the semiconductor laser chips may be increased in order that a narrower radiation angle can be further improved. Moreover, the semiconductor laser chips may be skewed so that the radiation direction is tilted from the vertical direction.

In Embodiment 1, a plurality of semiconductor laser chips each emitting a light beam having the same wavelength are covered with the molded resin 3. The plurality of semiconductor laser chips may emit light beams having different wavelengths. For example, two semiconductor laser chips emitting light having wavelengths of 910 nm and 950 nm, respectively, may be covered with the molded resin 3. In this case, a thus-constructed semiconductor laser device is included in a system at a transmitting side while two receiving elements capable of separately receiving two light beams having different wavelengths are included in a system at a receiving side. The separation of two light beams having different wavelengths at the receiving side can be achieved using a band filter or the like. An effective usage of such a semiconductor laser device is the following. A wide band signal, such as an image signal, is split into two signals. The two signals are simultaneously transmitted by the respective two laser light beams. With this method, it is possible to transmit information, which requires more bands than that supplied by a single semiconductor laser chip, using two semiconductor laser chips. The two signals can be transmitted by a wavelength separation method.

Embodiment 2

Figure 3:
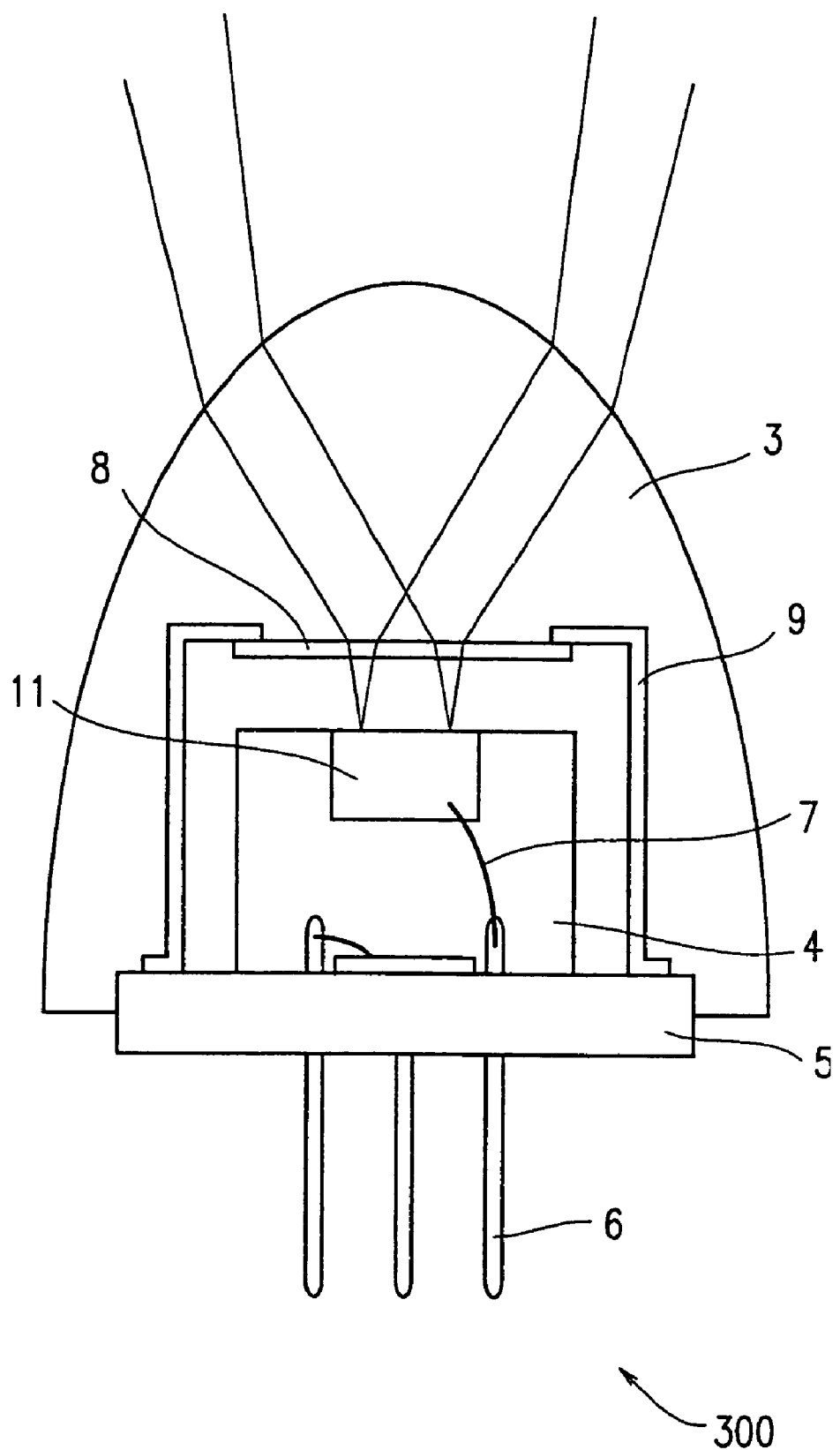
FIG. 3 is a cross-sectional view showing a semiconductor laser device of Embodiment 2 of the present invention.

FIG. 3 is a cross-sectional view showing a semiconductor laser device 300 according to Embodiment 2 of the present invention. In Embodiment 2, the semiconductor laser device 300 includes a multi-stripe semiconductor laser chip 11 (so-called semiconductor laser array). In FIG. 3, the stripe of a light emitting portion of the multi-stripe semiconductor laser chip 11 is not shown, but a pattern of the emitted light beams is shown.

In the semiconductor laser device 300, the multi-stripe semiconductor laser chip has a plurality of light emitting portions (stripes), so that the resistance of the semiconductor laser chip is decreased. Therefore, a driving voltage can be reduced. Further, similar to Embodiment 1, the spot size of the emitted light beam can be increased by adjusting the distance between the light emitting portions while maintaining the radiation angle. The light density at a light emitting facet of the semiconductor laser chip can be reduced, thereby securing the reliability even in the case of a single semiconductor laser. This is an advantageous point. In Embodiment 2, the stripes may be advantageously sloped by dry etching to form a mirror.

Alternatively, a wide-stripe semiconductor laser chip may be used to reduce the light density at a light emitting facet of the semiconductor laser chip. Also in this case, the reliability can be secured even in the case of a single semiconductor laser chip.

The inventors conducted an experiment in which the wavelength band of the semiconductor laser chip was changed in the range of about 760 nm to about 1.5 μm. When the stripe width was about 7 μm or more, the spot size and the radiation angle could be easily controlled. Further, the spot size and the radiation angle can be easily controlled by adjusting the interval between the stripes. The radiation characteristics of the semiconductor laser chip did not vary over time. The semiconductor laser chip having a wavelength band of about 760 nm to about 1.5 μm has greatly satisfactory characteristics compared with semiconductor laser chips having other wavelength bands.

Figure 16:
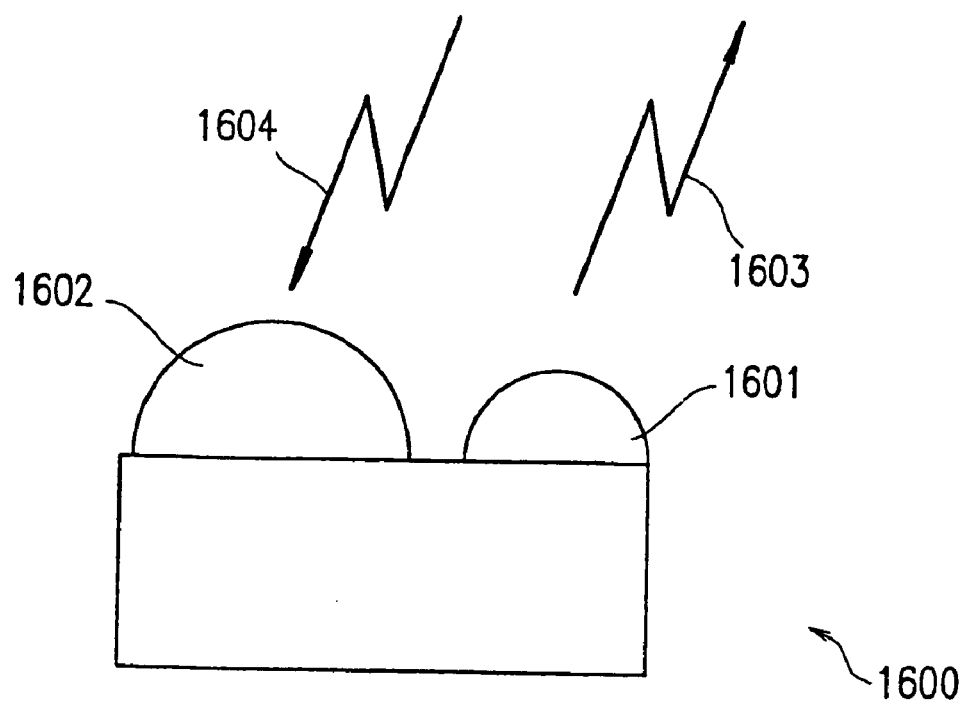
FIG. 16 is a cross-sectional view showing a conventional transmission and reception unit using infrared light.
Figure 17:
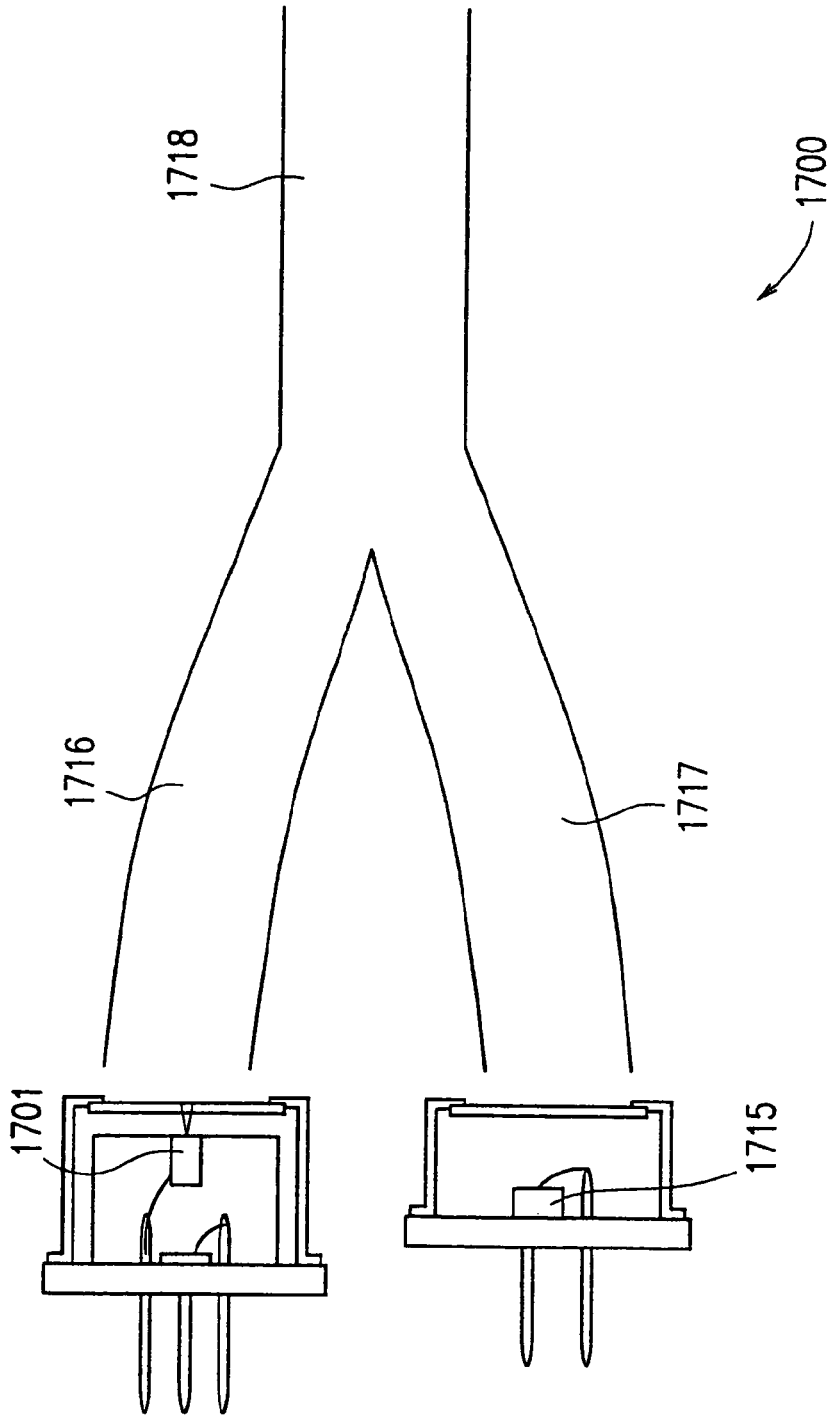
FIG. 17 is a cross-sectional view showing a transmission and reception unit used in a conventional fiber optical transmission.

In Embodiments 1 and 2, the semiconductor laser device is used as an only-transmitting unit. The same effect is obtained when the semiconductor laser device is incorporated into the conventional transmission and reception unit 1600 as shown in FIG. 16. A space optical transmission system including the transmission and reception unit can be operated in a very stable manner, and the reliability thereof is also satisfactory. Further, the semiconductor laser device can be effectively utilized as a light source for a sensor by adjusting the radiation angle and the spot size, thereby obtaining a stable operation.

In Embodiments 1 and 2, a plurality of semiconductor laser chips are connected to each other in parallel. A plurality of semiconductor laser chips may be connected to each other in series. Needless to say, the same effect can be obtained. Note that the parallel connection does not cause a reduction in resistance.

Embodiment 3

Figure 4:
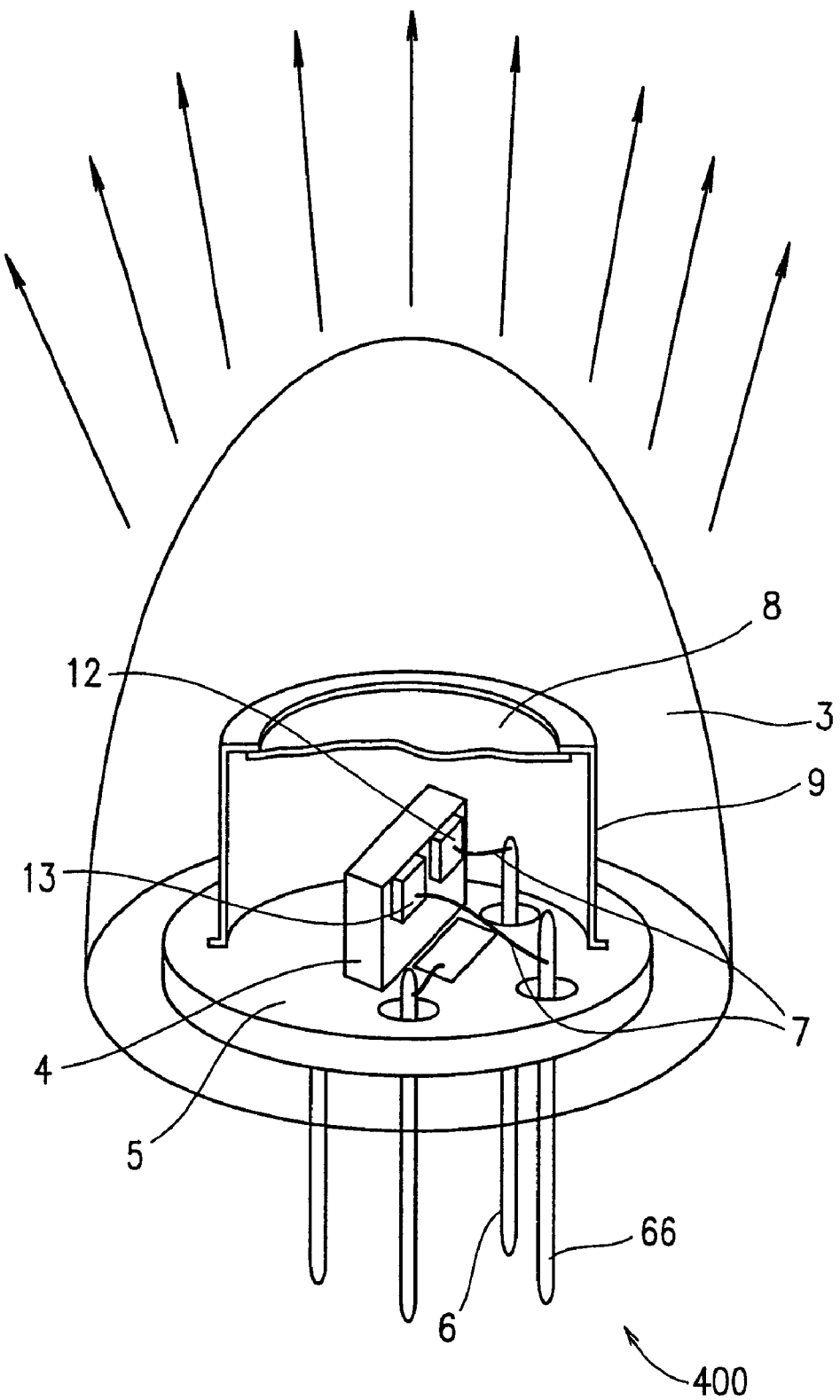
FIG. 4 is a perspective view showing a semiconductor laser device according to Embodiment 3 of the present invention.

FIG. 4 is a perspective view showing a semiconductor laser device 400 according to Embodiment 3 of the present invention. In Embodiment 3, the semiconductor laser device 400 includes a semiconductor laser package including two semiconductor laser chips 12 and 13. The semiconductor laser device 400 differs from that of Embodiment 1 in the following points.

1. The semiconductor laser chips 12 and 13 have different oscillation wavelengths. In Embodiment 3, the semiconductor laser chip 12 has an oscillation wavelength of about 980 nm. The semiconductor laser chip 13 has an oscillation wavelength of about 920 nm.

2. The semiconductor laser chips 12 and 13 are connected via the respective wires to different lead-pins 6 and 66, respectively. Accordingly, the package includes one more lead-pin than Embodiment 1.

Figure 5A:
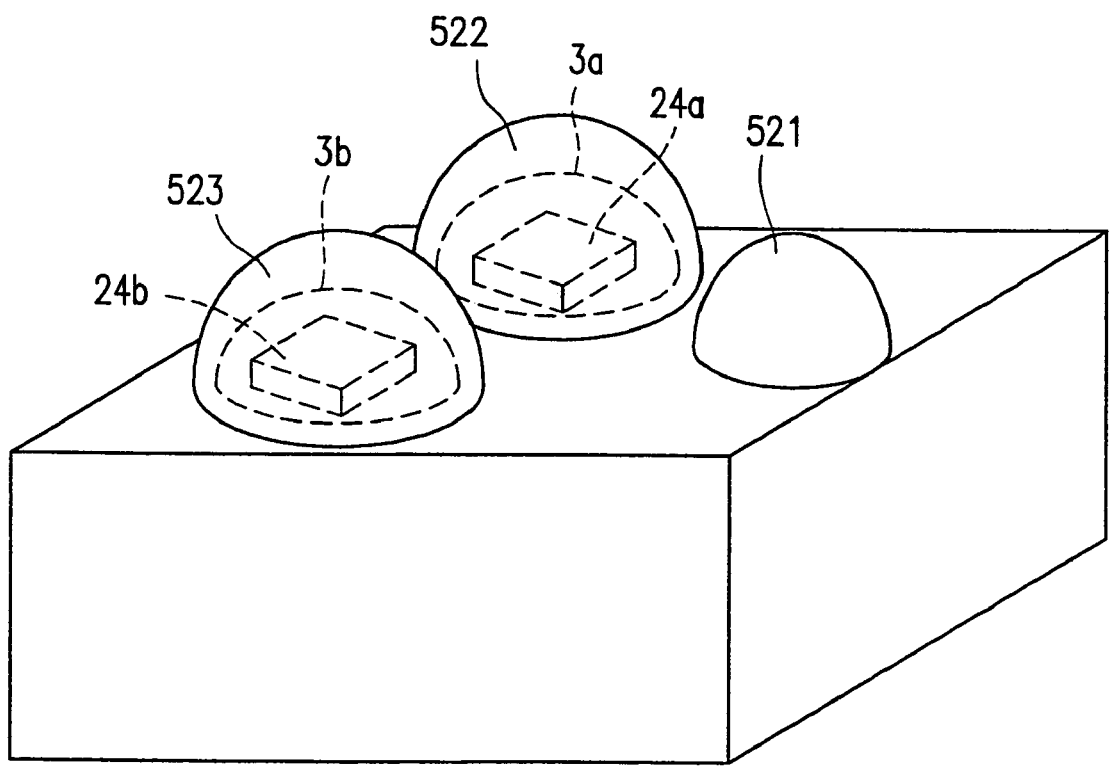
FIG. 5A is a perspective view showing an optical transmission and reception unit according to Embodiment 3 of the present invention.

Next, a transmission and reception unit 500 including the semiconductor laser device 400, and a space optical transmission system using the transmission and reception unit 500 will be described with reference to FIG. 5A. The transmission and reception unit 500 includes a transmission unit 521 and first and second reception units 522 and 523. In Embodiment 3, the semiconductor laser device 400 is used as the transmission unit 521. The first reception unit 522 includes a resin 3a and a light receiving element 24a. The second reception unit 523 includes a resin 3b and a light receiving element 24b.

The transmission unit 521 includes the semiconductor laser chips 12 and 13 having two different oscillation wavelengths shown in FIG. 4 which are covered with the resin 3. The light receiving elements 24a and 24b include in the reception units 522 and 523, respectively, are identical and made of silicon. The resins 3a and 3b which cover the identical light receiving elements 24a and 24b, respectively, are different from each other. The resin 3a included in the first reception unit 522 does not transmit a light beam having a wavelength of about 950 nm or less. The resin 3b includes in the second reception unit 523 did not transmit a light beam having a wavelength of about 900 nm or less.

Figure 5B:
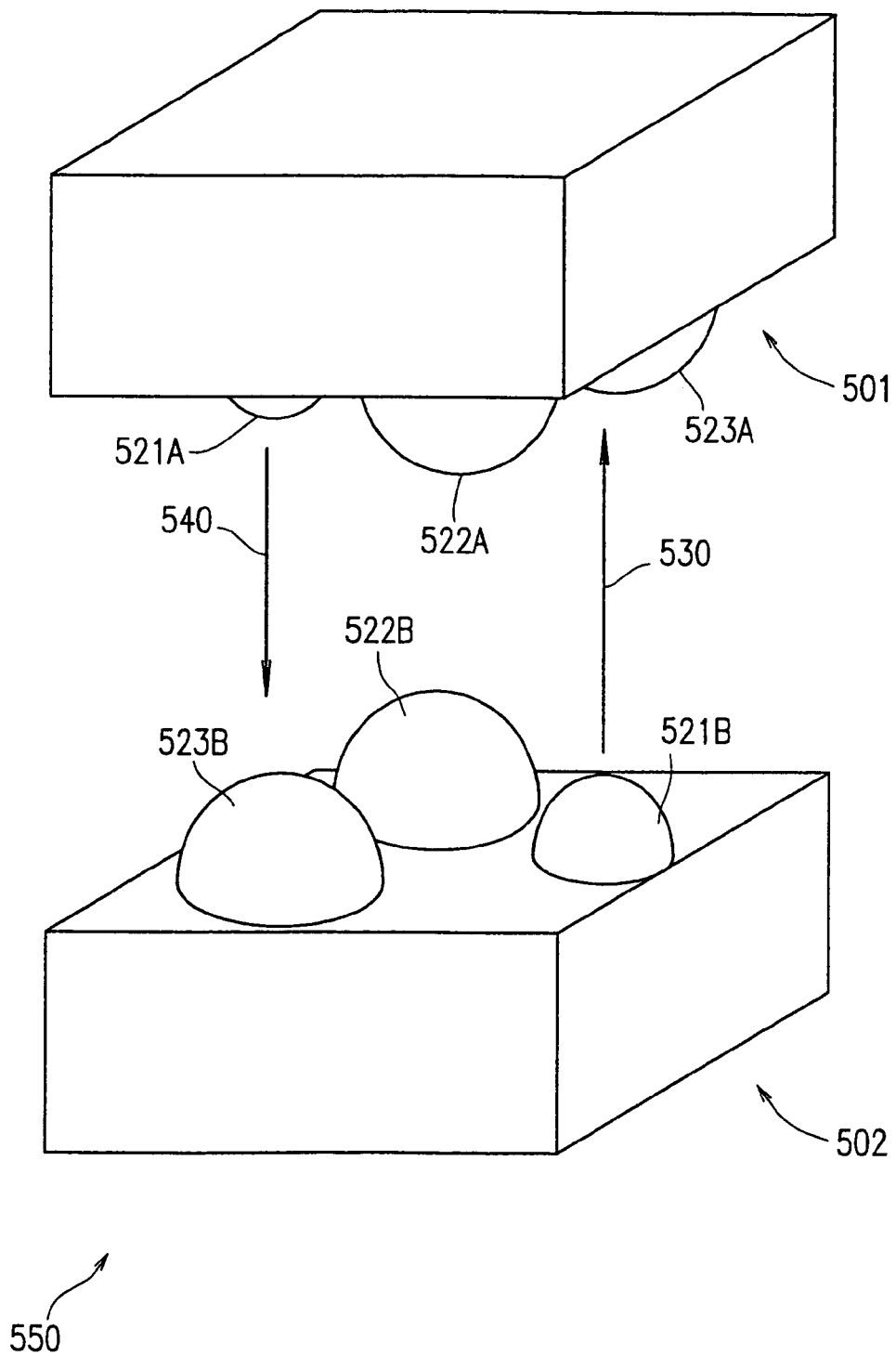
FIG. 5B is a perspective view showing an optical transmission and reception system according to Embodiment 3 of the present invention.

An optical transmission system 550, in which two-way communication is conducted using two transmission and reception units 500, will be described with reference to FIG. 5B. For the purpose of clear description, the two transmission and reception units are separately indicated by reference numerals 501 and 502. It is assumed that the transmission and reception unit 502 at the other party transmits a signal 530 which is in turn received by the transmission and reception unit 501. The transmission and reception unit 501 includes the transmission unit 521A and the first and second reception units 522A and 523A. The transmission and reception unit 502 includes the transmission unit 521B and the first and second reception units 522B and 523B.

The transmission unit 521B of the transmission and reception unit 502 includes the semiconductor laser chips 12 and 13 having two wavelengths of 980 nm and 920 nm. When a signal light beam 530 reaches the transmission and reception unit 501 from the transmission and reception unit 502 at the other party, it is unclear which of the semiconductor laser chips 12 and 13 is used for the transmission. To overcome such a situation, when the first or second reception unit 522A or 523A of the transmission and reception unit 501 receives the transmitted signal light beam 530, the transmission and reception unit 501 examines the levels of the first and second reception units 522A and 523A in the following way so as to determine the wavelength of the signal light beam 530 transmitted from the transmission unit 521B of the transmission and reception unit 502 at the other party.

State 1: When the transmission and reception unit 501 receives the signal light beam 530 by the first and second reception units 522A and 523A, it is determined that the transmission unit 521B of the transmission and reception unit 502 at the other party transmitted laser light beam having a wavelength of 980 nm.

State 2: When the transmission and reception unit 501 receives the signal light beam 530 not by the first reception unit 522A but by the second reception unit 523A, it is determined that the transmission unit 521B of the transmission and reception unit 502 at the other party transmitted laser light beam having a wavelength of 920 nm.

In this way, it is possible to determine the wavelength of the laser light beam 530 used by the transmission unit 521B of the transmission and reception unit 502 at the other party, since there were only the above-described two states in the case of reception of the laser signal 530 from the transmission and reception unit 502 at the other party. Such determination can be done in a short time. Based on this, the wavelength of the laser light beam 540 to be transmitted by the transmission unit 521A of the transmission and reception unit 501 to the transmission and reception unit 502 at the other party is determined. Such a wavelength is set to a wavelength different from that used by the transmission unit 521B of the transmission and reception unit 502 at the other party.

In the case of the state 1, the transmission and reception unit 501 transmits a light beam having a wavelength of 920 nm. In this case, a light beam transmitted from the transmission unit 521A of the transmission and reception unit 501 is not received by the first reception unit 522A of the transmission and reception 501, but only by the second reception unit 523A. Accordingly, the transmission and reception unit 501 received the laser light beam 530 from the transmission unit 521B of the transmission and reception unit 502 at the other party, using the first reception unit 522A without an influence of the transmitted signal of the transmission unit 521A of the transmission and reception unit 501. Note that the transmission and reception unit 502 inevitably receives the transmitted signal from the transmission and reception unit 501 by the reception units 522B and 523B of the transmission and reception unit 502. Thus, only the transmission and reception unit 501 can conduct the simultaneous transmission and reception.

In the case of the state 2, the transmission and reception unit 501 transmits a light beam having a wavelength of 980 nm. In this case, the transmitted light beam from the transmission unit 521A of the transmission and reception unit 501 is received by both the first and second reception units 522A and 523A of the transmission and reception unit 501. Thus, only the transmission and reception unit 502 at the other party can conduct the simultaneous transmission and reception.

In Embodiment 3, the identical transmission and reception units 500 are used. Thus, the full-duplex communication can be achieved using such general-purpose transmission and reception units. The cost of the transmission and reception unit is low. The mass production of the transmission and reception unit is possible. The present invention is not limited to the case where the identical transmission and reception units are used. The present invention includes the case where the reception unit has a restricted reception wavelength so that at least one transmission and reception unit can conduct the full-duplex communication.

Embodiment 4

Figure 6A:
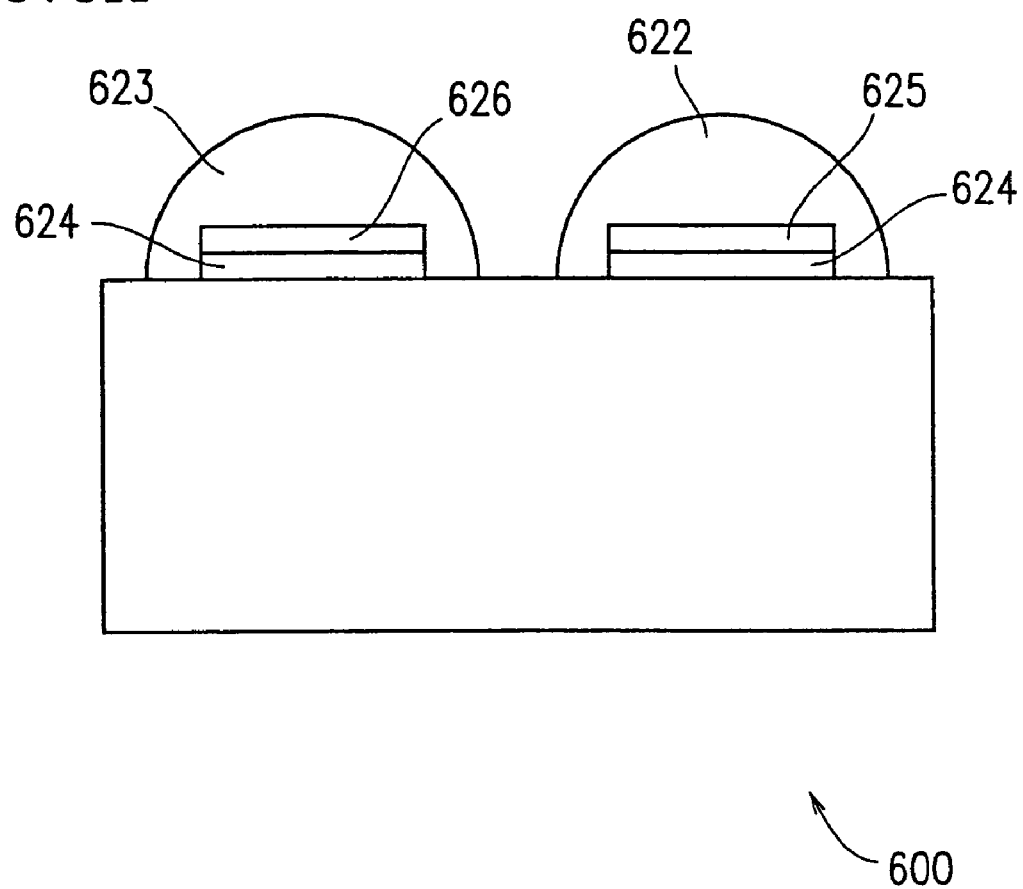
FIG. 6A is a cross-sectional view showing an optical transmission and reception unit according to Embodiment 4 of the present invention.
Figure 6B:
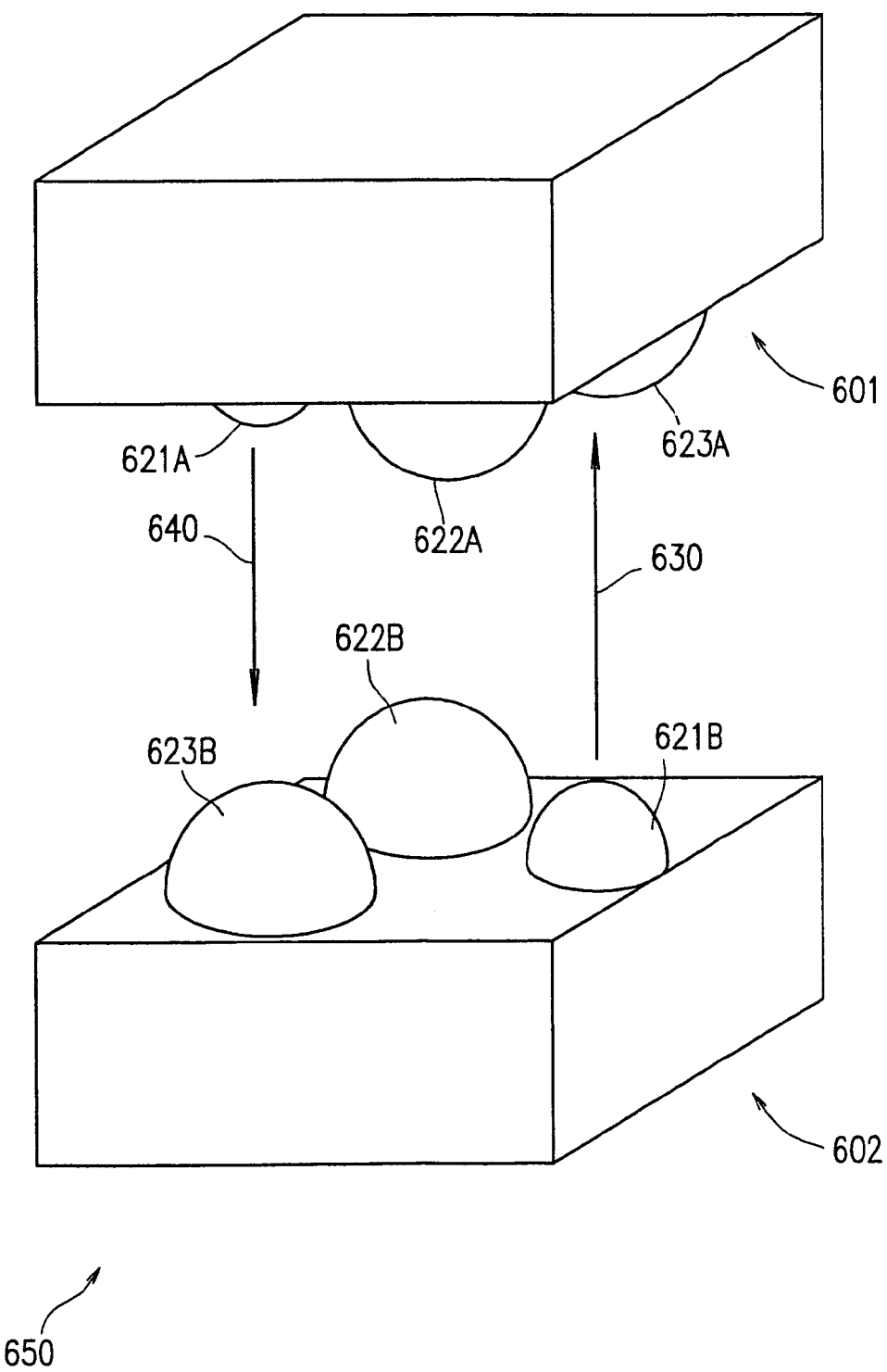
FIG. 6B is a perspective view showing an optical transmission and reception system according to Embodiment 4 of the present invention.

In Embodiment 4, a space optical communication system, in which the full-duplex communication is always possible, will be described. FIGS. 6A and 6B are diagrams showing a space optical transmission unit 600 of Embodiment 4. The space optical transmission unit 600 includes a transmission unit (not shown) and first and second reception units 622 and 623. Embodiment 4 differs from Embodiment 3 in the following points.

1. The molded resin does not have wavelength selectivity.

2. First and second wavelength selective filters 625 and 626 are provided on light receiving elements 624 of the first and second reception units 622 and 623, respectively.

3. The first wavelength selective filter 625 transmits a light beam having a wavelength of about 950 nm or more. The second wavelength selective filter 626 transmits a light beam having a wavelength of about 950 nm or less.

Two-way communication was conducted using two transmission and reception units 600. For the purpose of clear description, the two transmission and reception units are separately indicated by reference numerals 601 and 602 as shown in FIG. 6B. It is assumed that the transmission and reception unit 602 at the other party transmits a signal which is in turn received by the transmission and reception unit 601. The transmission and reception unit 601 includes the transmission unit 621A and the first and second reception units 622A and 623A. The transmission and reception unit 602 includes the transmission unit 621B and the first and second reception units 622B and 623B.

The transmission unit 621B of the transmission and reception unit 602 includes the semiconductor laser chips 12 and 13 having two wavelengths of 980 nm and 920 nm. When a signal light beam reaches the transmission and reception unit 601 from the transmission and reception unit 602 at the other party, it is unclear which of the semiconductor laser chips 12 and 13 is used for the transmission. To overcome such a situation, when the first or second reception unit 622A or 623A of the transmission and reception unit 601 receives the transmitted signal light beam, the transmission and reception unit 601 examines the levels of the first and second reception units 622A and 623A in the following way so as to determine the wavelength of the signal light beam transmitted from the transmission unit 621B of the transmission and reception unit 602 at the other party.

State 1: When the transmission and reception unit 601 receives the signal light beam by the first reception unit 622A, but not by the second reception unit 623A, it is determined that the transmission unit 621B of the transmission and reception unit 602 at the other party transmits a laser light beam having a wavelength of 980 nm to the transmission and reception unit 601.

State 2: When the transmission and reception unit 601 receives the signal light beam not by the first reception unit 622A but by the second reception unit 623A, it is determined that the transmission unit 621B of the transmission and reception unit 602 at the other party transmits a laser light beam having a wavelength of 920 nm to the transmission and reception unit 601.

In this way, it is possible to determine the wavelength of the laser light beam used by the transmission unit 621B of the transmission and reception unit 602 at the other party, since there are only the above-described two states in the case of reception of the laser signal from the transmission and reception unit 602 at the other party. Such determination can be done in a short time. Based on this, the wavelength of a laser light beam to be transmitted by the transmission unit 621A of the transmission and reception unit 601 to the transmission and reception unit 602 at the other party is determined. Such a wavelength is set to a wavelength different from that used by the transmission unit 621B of the transmission and reception unit 602 at the other party.

In the case of the state 1, the transmission unit 621A of the transmission and reception unit 601 transmits a light beam having a wavelength of 920 nm. In this case, a light beam transmitted from the transmission unit 621A of the transmission and reception unit 601 is not received by the first reception unit 622A of the transmission and reception 601, but only by the reception unit 623A. Accordingly, the transmission and reception unit 601 receives the laser light beam from the transmission unit 621B of the transmission and reception unit 602 at the other party, using the first reception unit 622A without an influence of the transmitted signal from the transmission and reception unit 601. Thus, the full-duplex communication is realized.

In the case of the state 2, the transmission unit 621A of the transmission and reception unit 601 transmits a light beam having a wavelength of 980 nm. In this case, a light beam transmitted from the transmission unit 621A of the transmission and reception unit 601 is received by the first reception unit 622A of the transmission and reception 601, but not by the reception unit 623A. Accordingly, the transmission and reception unit 601 receives the laser light beam from the transmission unit 621B of the transmission and reception unit 602 at the other party, using the second reception unit 623A without an influence of the transmitted signal from the transmission and reception unit 601. Thus, the full-duplex communication is realized.

Therefore, in either case, the wavelength of the signal light beam from the transmission unit 621B of the transmission and reception unit 602 is determined in a short time. The semiconductor laser to be used in the transmission unit 621A of the transmission and reception unit 601 is determined. Using the determined semiconductor laser, the transmission and reception unit 601 transmits a signal light beam to the transmission and reception unit 602. Thus, the full-duplex communication is realized.

In Embodiment 4, one of the two wavelength filters transmits a light beam having a given wavelength (950 nm) or more. The other wavelength filter of the two wavelength filters transmits a light beam having a given wavelength (950 nm) or less. The range of the wavelength filter is not limited to this. The present invention includes the case where the wavelength ranges of light beams transmitted in the two wavelength filters do not overlap each other. It will be understood by those skilled in the art that a band bass filter may be used as the wavelength filter.

Further, three or more semiconductor laser chips having different wavelengths may be used. If at least one band pass filter is used as a wavelength filter provided for the light receiving element, simultaneous communication among three or more parties is possible in theory.

Next, a procedure for establishing a connection before starting the signal transmission and reception will be described in more detail. It is assumed that the transmission and reception are conducted between a terminal A and a terminal B. The terminals A and B each include a plurality of semiconductor laser chips or a multi-wavelength laser element capable of transmitting two light beams having different wavelengths, $\lambda 1$ and $\lambda 2$; and a light emitting element including a determination means capable of determining these wavelengths.

Initially, a procedure for establishing a connection, where the terminal A starts transmission earlier than the terminal B, will be described with reference to FIG. 7. In FIG. 7, time elapses from the top to the bottom.

In step 1, the terminal A verifies that no data signal light beam or transmission request signal from other terminals is being detected. Thereafter, the terminal A transmits a transmission request signal to the terminal B using a light beam having a wavelength of $\lambda 1$.

In step 2, if the terminal B verifies the transmission request signal from the terminal A, then the terminal B transmits a reception response signal in forming the transmitting side of the reception using a light beam having a wavelength of $\lambda 2$.

In step 3, the terminal A verifies the reception response signal from the terminal B. In this way, the connection is established.

Thereafter, the terminal A transmits a light beam having a wavelength of $\lambda 1$ and receives a light beam having a wavelength of $\lambda 2$. The terminal B transmits the light beam having a wavelength of $\lambda 2$ and receives the light beam having a wavelength of $\lambda 1$. In this way, the wavelength division allows the data transmission and reception to be performed in a full duplex bi-directional way. In the case where the terminal B starts transmission earlier than the terminal A, the full duplex two-way communication is possible.

Figure 8:
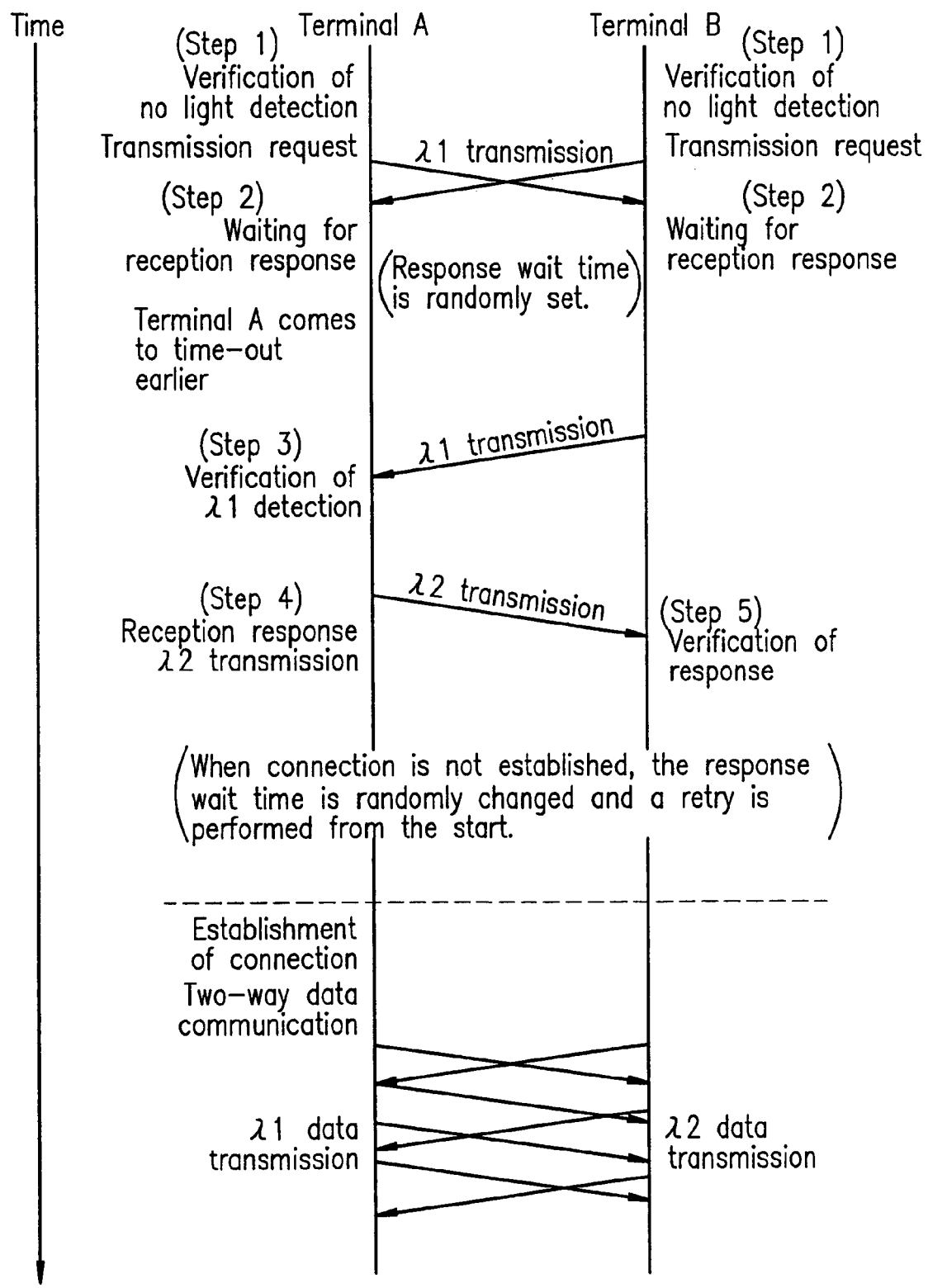
FIG. 8 is a diagram showing a connection establishment protocol when both of two terminals start transmission.

Next, a procedure for establishing a connection, in which the terminal A and the terminal B simultaneously start transmission both using a light beam having a wavelength of $\lambda 1$, will be described with reference to FIG. 8. Also in FIG. 8, time elapses from the top to the bottom.

In step 1, the terminal A and the terminal B both verify that no data signal light beam or transmission request signal from other terminals is detected. Thereafter, the terminal A and the terminal B simultaneously transmit transmission request signals using a light beam having a wavelength of $\lambda 1$. In this case, both the terminals A and B automatically enter a state in which the light receiving elements for receiving a light beam having a wavelength of $\lambda 1$ cannot be received.

In step 2, since both the terminals A and B cannot receive a light beam having a wavelength of $\lambda 1$, no light is detected by the terminal A or B. A state of waiting for a response continues in the terminals A and B. In this case, a response waiting time is randomly set in each of the terminals A and B. The response waiting time is changed every time each of the terminals A and B transmits the transmission request. Therefore, one of the terminals A and B comes to time-out earlier than the other.

If the terminal A comes to time-out earlier than the terminal B in step 3, the terminal A is allowed to receive a light beam having a wavelength of $\lambda 1$. Subsequently, the terminal A verifies detection of a light beam having a wavelength of $\lambda 1$ emitted from the terminal B again.

Based on the detection of a light beam having a wavelength of $\lambda 1$, the terminal A transmits a reception response signal using a light beam having a wavelength of $\lambda 2$ in step 4.

In step 5, the terminal B verifies the reception response signal from the terminal A. In this way, the connection is established.

Once the connection has been established, data transmission and reception can be conducted by the full-duplex two-way communication using the wavelength division, similar to FIG. 7. When a connection is not established, the response waiting time is randomly changed and the procedure is repeated again from step 1. Therefore, a connection will eventually be established in any situation.

Figure 9:
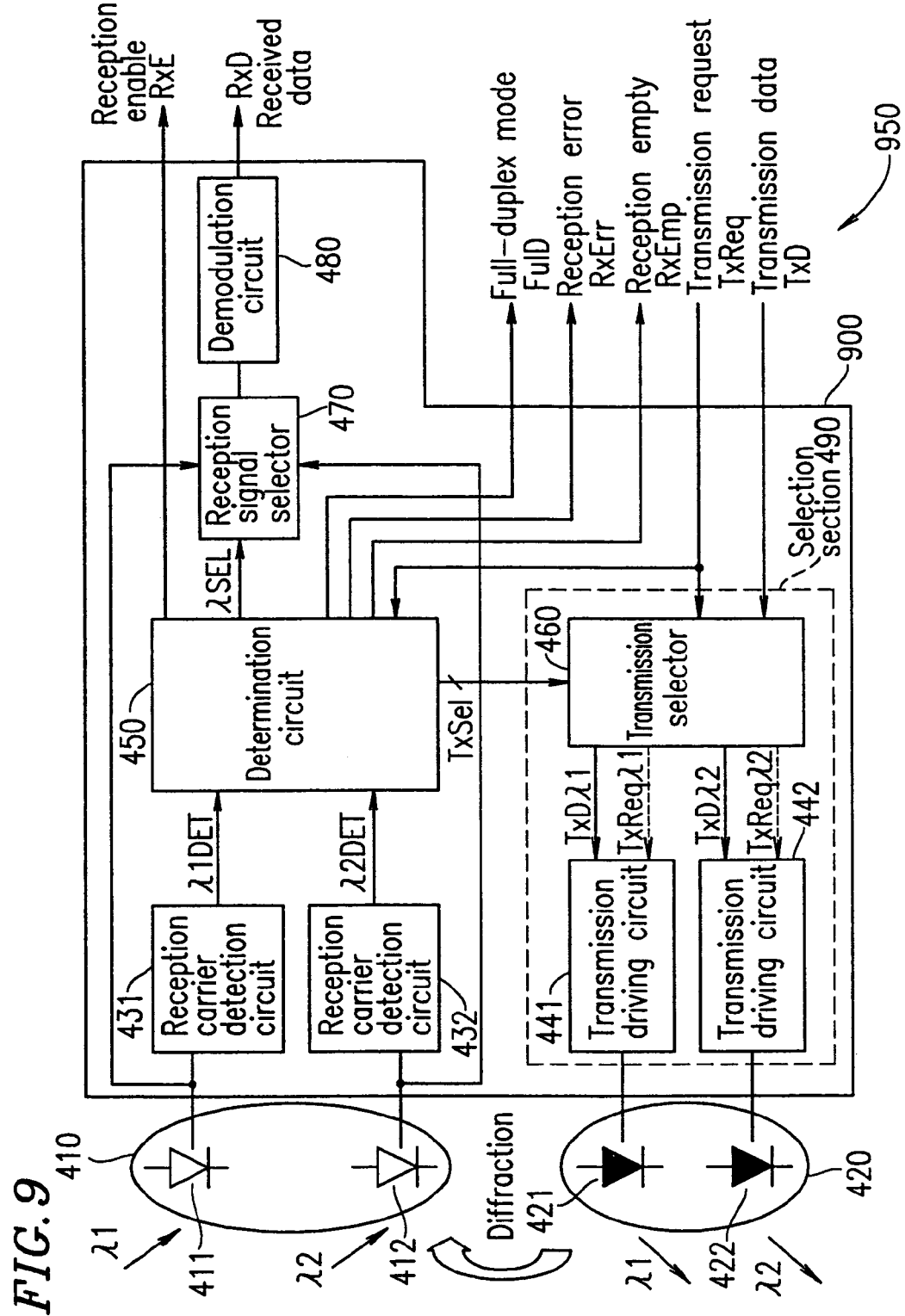
FIG. 9 is a block diagram of the signal processing circuits of a semiconductor laser driving circuit and a light receiving element for automatically establishing connection.

FIG. 9 is a block diagram showing a communication device 950 for automatically performing the above-described procedure. The communication device 950 includes a control device 900, a light emitting module 420, and a light receiving module 410. The above-described semiconductor laser device including different semiconductor laser chips may be used as the light emitting module 420. The above-described reception unit of the transmission and reception unit may be used as the light receiving unit 410. The full duplex optical communication can be realized using the communication device 950. Hereinafter, the operation of the communication device 950 will be described.

The light emission module 410 includes single-wavelength light receiving elements 411 and 412. The single-wavelength light receiving element 411 has a filtering ability to selectively receive a light beam having a wavelength of $\lambda 1$. The single-wavelength light receiving element 412 has a filtering ability to selectively receive a light beam having a wavelength of $\lambda 2$. In Embodiment 4, the single-wavelength light receiving elements 411 and 412 are packaged into the light receiving module 410. Alternatively, the single-wavelength light receiving elements 411 and 412 may be separately packaged.

The control device 900 includes a light detection section, a determination section, a demodulation section, and a selection section 490. Reception carrier detection circuits 431 and 432 are used as the light detection section. A determination circuit 450 is used as the determination section. A demodulation circuit 480 is used as the demodulation section. The selection section 490 includes a transmission selector 460 and transmission driving circuits 441 and 442.

The reception carrier detection circuit 431 determines whether a signal having a wavelength of $\lambda 1$ received through the light receiving element 411 is valid. If it is valid, the reception carrier detection circuit 431 outputs a signal ($\lambda 1$DET) indicating the validity, to the determination circuit 450. The reception carrier detection circuit 432 determines whether a signal having a wavelength of $\lambda 2$ received through the light receiving element 412 is valid. If it is valid, the reception carrier detection circuit 432 outputs a signal ($\lambda 2$DET) indicating the validity, to the determination circuit 450.

The determination circuit 450 determines the wavelength of an input signal. If the input signal can be received, the determination circuit 450 outputs a reception enable signal (RxE), a reception select signal ($\lambda$SEL) for introducing only a valid input signal to the demodulation circuit 480, and a transmission control signal (TxSel). The transmission control signal (TxSel) is used for selecting a transmitted signal having a wavelength different from that of the input signal when the transmission request signal (TxReq) is active. When a signal is transmitted from the light emitting module 420 to other communication devices, the signal may be diffracted into the light receiving module 410 of the communication device 950, resulting in a malfunction. To avoid the malfunction, the determination circuit 450 may include a reception detection select circuit (not shown) for invalidating detection of a light beam so that the reception module 410 does not receive a light signal having a wavelength to another communication device.

In Embodiment 4, the communication device further includes a reception signal selector 470 which selects a valid input signal based on a reception selector signal. The demodulation circuit 480 demodulates a selected signal.

The transmission selector 460 selects a wavelength to be transmitted, in accordance with a transmission request from the determination circuit 450, and selects the corresponding transmission driving circuits 441 and 442. The transmission driving circuits 441 and 442 drive the single-wavelength light emitting elements 421 and 422, respectively. The single-wavelength light emitting elements 421 and 422 correspond to the wavelengths, $\lambda 1$ and $\lambda 2$, respectively. In Embodiment 4, the light emitting module 420 includes the single-wavelength light emitting elements 421 and 422. Alternatively, the single-wavelength light emitting elements 421 and 422 may be included in separate modules, depending on applications. When the single-wavelength light emitting elements 421 and 422 are to be never driven simultaneously, the two transmission driving circuits (441 and 442) may be integrated to one circuit. In this case, a selector circuit is provided at the output side of the driving circuit. This leads to a reduction in the scale of a circuit while the basic operation of the circuit is the same. Modulation circuits for transmission are included in the driving circuits 441 and 442, respectively. In some modulation methods, the modulation circuits may be separated from the driving circuits 441 and 442 and may be provided at the transmission data input side of the transmission selector 460.

The determination circuit 450 for effectively operating the communication device 950 can be realized by software or hardware. The case where the determination circuit 450 is realized by software will be initially described.

When neither the single-wavelength light emitting elements 421 nor 422 are transmitting, the transmission request signal (TxReq) and the detection signals ($\lambda 1$DET, $\lambda 2$DET) are inactive. Initially, the states of the detection signals $\lambda 1$DET and $\lambda 2$DET are checked. When both $\lambda 1$DET and $\lambda 2$DET are inactive, no signal is received (empty state: RxEmp). When both $\lambda 1$DET and $\lambda 2$DET are active, an error state occurs (RxErr) in which transmission is impossible. The determination circuit 450 outputs the RxEmp signal or the RxErr signal to a higher level communication module, depending on states. When one of $\lambda 1$DET and $\lambda 2$DET is active, the active signal indicates that the corresponding single-wavelength light emitting element 421 or 422 is transmitting. In this case, the determination circuit 450 recognizes a reception enable state (RxE).

When a higher level communication module generates a data transmission request, the transmission request signal (TxReq) becomes active, or a transmission request instruction is generated. In response to this, the status of the detection signals $\lambda 1$DET and $\lambda 2$DET are checked as described above. When the state of the reception is the empty state, but not the error state, transmission is possible. In this case, the transmission driving circuit 441 for the wavelength $\lambda 1$ or the transmission driving circuit 442 for the wavelength $\lambda 2$ is selected and transmission is started using the selected transmission driving circuit. Now it is assumed that the transmission driving circuit 441 is selected. When the communication device 950 transmits a signal, the signal may be received by the light receiving module 410 (light receiving element 411) thereof due to diffraction, reflection, and the like. This prevents the full-duplex communication with a single-wavelength light. Therefore, after the transmission has started, the output of the reception carrier detection circuit 431 needs to be invalidated, or the above-described method for determining the reception state needs to be changed. The reception carrier detection circuit 431 detects a reception carrier output by the light receiving module 410 which detects a transmitted light beam having a wavelength of $\lambda 1$. In this situation, the communication device 950 waits for a light beam having a wavelength of $\lambda 2$ which is a response from the communication device at the other party. The determination circuit 450 monitors the output ($\lambda 2$DET) of the reception carrier detection circuit 432 and switches the reception signal selector 470 to the wavelength $\lambda 2$ in accordance with the reception selector signal ($\lambda$SEL) to demodulate the reception signal. When the output of the reception carrier detection circuit 432 which detects a light beam having a wavelength of $\lambda 2$ becomes active, the full-duplex communication path is established so that communication is ready.

At that time, the operation at the receiving side is as follows. Since communication has not started, the outputs $\lambda 1$DET and $\lambda 2$DET of the reception carrier detection circuits 431 and 432 for detecting light beams having wavelengths of $\lambda 1$ and $\lambda 2$, respectively are inactive and in the empty state. The receiving side is waiting for a signal. When the communication device starts communication and transmits a light beam having a wavelength of $\lambda 1$, for example, the reception carrier detection circuit 431 detects the transmitted light beam and the output thereof becomes active. At that point, when the reception carrier detection circuit 432 detects a light beam having a wavelength of $\lambda 2$, the reception carrier detection circuit 432 enters an error state, so that it cannot perform communication. When the output of the reception carrier detection circuit 431 alone is active, the communication device 950 can receive a transmitted signal and switch the signal selector 470 to the wavelength $\lambda 1$ to transfer a signal having a wavelength of $\lambda 1$ to the demodulation circuit 480. The communication device 950 makes the reception enable signal active or informs a higher level communication module of instruction of reception enable. When receiving this information, the higher level communication module recognizes the reception ready state and requests transmission of a response. The communication device 950 receives the transmission request, and drives the transmission driving circuit 442 for a light beam having a wavelength of λ2 since the communication device 950 determines that a signal having a wavelength of λ2 is not currently used. A reception response signal is transmitted by the light emitting element 422. During the transmission of the reception response signal, the output of the reception carrier detection circuit 432 is active since it detects a light beam having a wavelength of λ2 due to diffraction of the light. Such an output needs to be invalidated or the above-described determination method needs to be changed. In this way, a full-duplex communication path is established and two-way data communication can start.

Collision may occur when simultaneous transmission is performed. A communication protocol to overcome such a situation can be realized using a higher level communication module. A timer in which a random response time is provided can also be realized using a higher level communication module. The operation of those higher level communication modules is described above.

Figure 10:
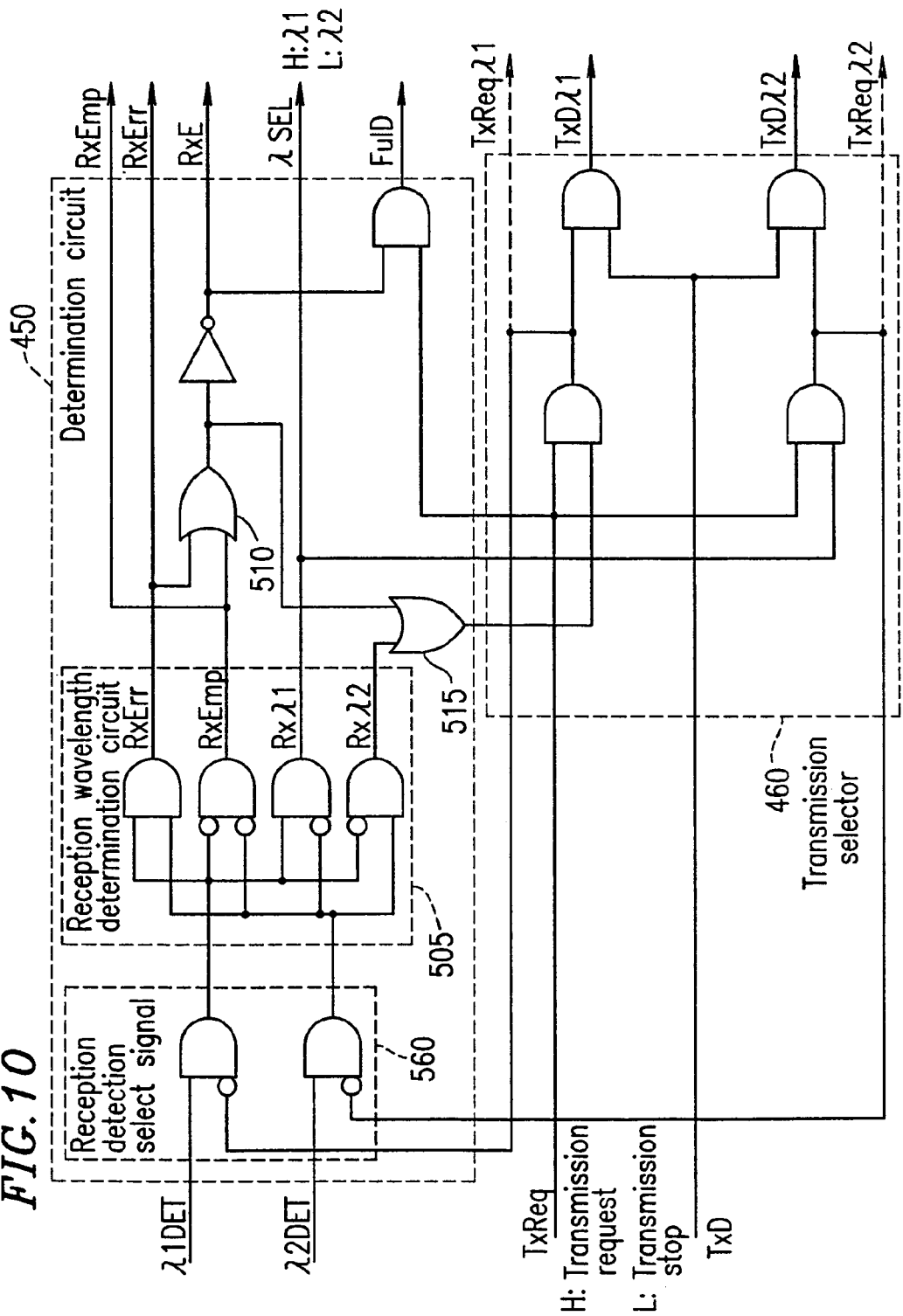
FIG. 10 is a diagram showing an example of a circuit for realizing a determination circuit and a transmission selector in FIG. 9 by hardware.

Next, examples of the circuit configurations of the determination circuit 450 and the transmission selector 460 implemented by hardware will be described with reference to FIG. 10. The present invention is not limited to this. Other circuits having the same functions may be used.

In order to prevent the erroneous determination due to the signal diffraction upon transmission, the determination circuit 450 includes a reception detection select circuit 560, a reception wavelength determination circuit 505, and general-purpose gates 510 and 515. The transmission selector 460 and the input and output interfaces of the determination circuit 450 basically correspond to the signals shown in FIG. 9. The basic operation thereof is the same as the above-described operation controlled by software.

When neither the light emitting element 421 nor 422 is transmitting, the transmission request signal (TxReq) and the detection signal for λ1 and λ2 (λ1DET, λ2DET) are inactive. Therefore, the transmission request signal TxReqλ1 and TxReqλ2 corresponding the respective wavelengths are inactive. The λ1DET and λ2DET signals are logically inversed and input to the input terminal of an AND circuit of the reception detection select circuit 560. The λ1DET and λ2DET signals pass through the reception detection select circuit 560 and is conducted to the reception wavelength determination circuit 505. The reception wavelength determination circuit 505 examines these signals and when both the signals are inactive, it determines the empty state (RxEmp) where no signal is received; when both the signals are active, it determines the error state (RxErr) where transmission is impossible; or when one of both the signals is active, it determines the state (Rxλ1 or Rxλ2) where the corresponding signal is received. Thus, as a result of the determination of the reception wavelength determination circuit 505, the active RxEmp indicates the empty state. The active ExErr indicates the error state. The output of the reception wavelength determination circuit 505 is output through the general-purpose gate 510 as the reception enable signal (RxE). The reception enable signal (RxE) is inactive in the reception error state (RxErr) or the empty state (RxEmp); and is active when only one of two light beams having the different wavelengths is received.

The general-purpose gate 515 is a circuit for selecting a light beam having a wavelength of λ1 when transmission is started in the reception empty state (RxEmp). In this case, when the higher level communication module generates the data transmission request, the transmission request signal (TxReq) is active after verifying that the communication path is empty (i.e., RxEmp is active). In this situation, the output of the general-purpose gate 515 is active (H). The transmission request signal TxReqλ1 for a light beam having a wavelength of λ1 is active (H) when the transmission request signal (TxReq) is active (H). Transmission data (TxD) passes through an AND gate and is output to TxDλ1 to drive the transmission driving circuit 441. The transmission request signal TxReqλ1 may be used to control transmission driving circuit. In this case, the transmission request signal TxReqλ1 is a gate signal of the λ1DET signal. Therefore, when the λ1DET signal is inactive during transmission of a light beam having a wavelength of λ1 so that the erroneous detection due to light diffraction or reflection is prevented, the transmission driving circuit 441 is locked into a ready state where a signal having a wavelength of λ2 is waited. In this situation, a light beam having a wavelength of λ1 cannot be detected, so that a light beam having a wavelength of λ2 is not transmitted by the transmission selector 460.

In this situation, when the communication device at the other party receives a signal having a wavelength of λ1 and transmits a response using a light beam having a wavelength of λ2, the output λ2DET of the reception carrier detection circuit 432 becomes active, and the Rxλ2 of the reception wavelength determination circuit 505 becomes active (H). In association with this, the reception enable signal RxE becomes active. The reception selector signal λSEL is originally L and the reception signal selector 470 selects a light beam having a wavelength of λ2, so that the signal λSEL is demodulated by the demodulation circuit 480 to obtain reception data RxD. A higher level communication module determines that the full-duplex communication path is established, based on the active reception enable signal RxE. Thus, communication can start. In this case, the output of Rxλ2 becomes active (H) and the output of the general-purpose gate 510 falls to L. The output of the general-purpose gate 515 is not changed, so that the transmission using a light beam having a wavelength of λ1 is not changed. Further, a signal FulD for indicating establishment of the full-duplex communication may be output by passing the reception enable signal RxE and the transmission request signal TxReq through an AND gate.

Next, the operation of the receiving side will be described. It is assumed that when the communication device at the receiving side is in the ready state for receiving (the initial state where communication has not started yet), the communication device at the receiving side receives a signal light beam having a wavelength of λ1. In the ready state, the transmission request signal (TxReq) is inactive (L), so that the gates of the reception detection select circuit 560 are both open. In this case, the communication device can detect either a light beam having a wavelength of λ1 or a light beam having a wavelength of λ2. If both a light beam having a wavelength of λ1 or a light beam having a wavelength of λ2 are received, the reception wavelength determination circuit 505 determines that error occurs, and the reception enable signal RxE is not active. If one of a light beam having a wavelength of λ1 and a light beam having a wavelength of λ2 is received, the reception enable signal RxE is active, indicating a state where reception is possible. In this assumption, a light beam having a wavelength of λ1 is received, the output Rxλ1 of the reception wavelength determination circuit 505 is H. Since λSEL is the signal Rxλ1, the reception signal selector 470 selects a signal having a wavelength of λ1 and the signal is demodulated by the demodulation circuit 480 to obtain the received data RxD. A higher level communication module examines the reception enable signal RxE. When it is verified that the signal indicates the reception state, the transmission request signal TxReq is transmitted in responsive to the signal. In this case, the output Rxλ1 of the reception wavelength determination circuit 505 is H, and the output of the general-purpose gate 515 is L. The transmission request signal TxReqλ2 for a light beam having a wavelength of λ2 becomes active. The transmission driving circuit 442 corresponding to the wavelength λ2 is driven to transmit a reception response signal having a wavelength of λ2 from the light emitting element 422. Meantime, since TxReqλ2 is the gate signal for the λ2DET signal in the reception detection select circuit 560, λ2DET becomes inactive, so that the circuit is locked. Therefore, the transmission is fixed to the wavelength λ2 while the reception is fixed to the wavelength λ1, thereby making it possible to perform the full-duplex communication.

As described above, the control device detects the reception state of a light beam having each wavelength to determine the wavelength of a light beam transmitted from the other party. In this case, the control device determines whether reception can be performed. If possible, the control device demodulates only the detected light beam to obtain data. On the other hand, a light beam having a wavelength different from the detected wavelength is automatically selected and transmitted by the control device upon reception of a response transmission request. Thus, the full-duplex communication path can be automatically provided using the control device, a semiconductor laser device capable of transmitting light beams having different wavelengths separately, and a light receiving element capable of selectively receiving a light beam having each wavelength.

Embodiment 5

Figure 11A:
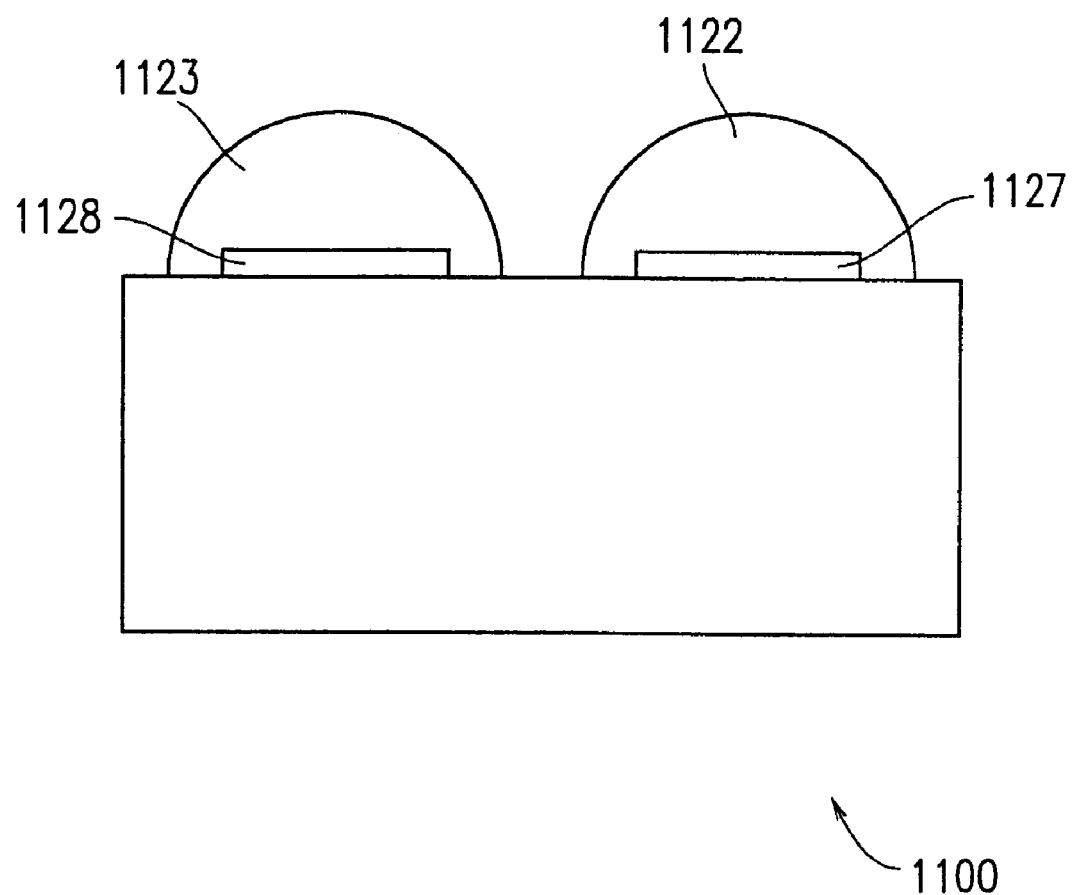
FIG. 11A is a cross-sectional view showing an optical transmission and reception unit according to Embodiment 5 of the present invention.
Figure 11B:
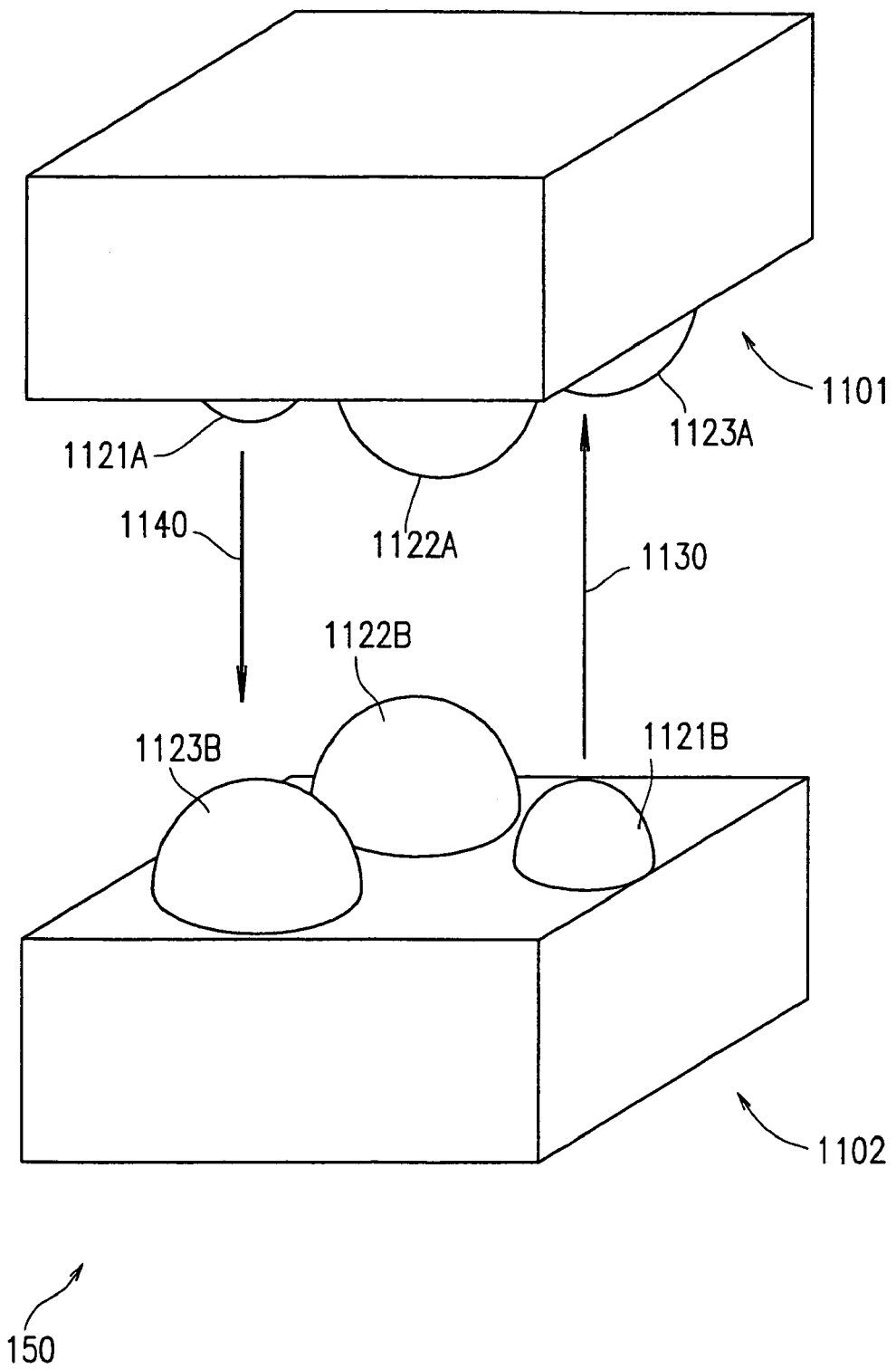
FIG. 11B is a perspective view showing an optical transmission and reception system according to Embodiment 5 of the present invention.

Also in Embodiment 5, a space optical transmission method capable of the full-duplex communication will be described. FIG. 11 is a cross-sectional view showing a space optical communication unit 1100 according to Embodiment 5 of the present invention. Embodiment 5 differs from Embodiment 4 in the following points.

1. A transmission unit (not shown) includes two semiconductor laser chips for transmitting light beams having wavelengths of about 900 nm and about 1.2 μm, respectively.

2. A first reception unit 1122 includes a silicon-based light receiving unit 1127, having a light reception sensitivity of about 1 μm or less. A second reception unit 1123 includes an Indium-Gallium-Arsenic (InGaAs)-based light receiving element 1128, having a light reception sensitivity of about 1 μm or more.

3. Neither the reception unit 1122 nor 1123 includes a filter.

It is assumed that two transmission and reception units are used to perform two-way communication. For the sake of simplicity, the two transmission and reception units are distinguished by indicating by reference numerals 1101 and 1102 (see FIG. 11B). It is also assumed that the transmission and reception unit 1101 receives a signal transmitted from a transmission and reception unit 1102 at the other party. It is further assumed that the transmission and reception unit 1101 includes a transmission unit 1121A, a first reception unit 1122A, and a second reception unit 1123A; and the transmission and reception unit 1102 includes a transmission unit 1121B, a first reception unit 1122B, and a second reception unit 1123B.

The transmission and reception unit 1102 also includes a semiconductor laser chip capable of transmitting two light beams having wavelengths of about 900 nm and about 1.2 μm. It is not possible to predesignate which of the light beams is transmitted. Upon reception of the transmitted signal light beam, the transmission and reception unit 1101 must determine the wavelength of the light beam transmitted by the transmission and reception unit 1102, by checking the reception levels of the first and second reception units 1122A and 1123A of the transmission and reception unit 1101.

State 1: When the first reception unit 1122A receives a signal light beam but the second reception unit 1123A does not receive a signal light beam, it is recognized that the transmission and reception unit 1102 transmits the signal light beam using the laser light beam having a wavelength of about 900 nm of the transmission unit 1121B thereof.

State 2: When the first reception unit 1122A does not receive a signal light beam but the second reception unit 1123A receives a signal light beam, it is recognized that the transmission and reception unit 1102 transmits the signal light beam using the laser light beam having a wavelength of about 1.2 μm of the transmission unit 1121B thereof.

Possible states are only the above-described two states when the transmission and reception unit 1102 transmits a signal. Therefore, it is possible to determine the wavelength of the laser light beam used by the transmission unit 1121B of the transmission and reception unit 1102. Such determination can be done in a short time. Based on the determination, the wavelength of the laser light beam of the transmission unit 1121A to be used for transmission from the transmission and reception unit 1101 is determined. This wavelength is set to be a wavelength different from that used by the transmission unit 1121B of the transmission and reception unit 1102.

In the case of State 1, the transmission unit 1121A of the transmission and reception unit 1101 transmits a light beam having a wavelength of about 1.2 μm. In this case, the transmitted light beam from the transmission and reception unit 1101 is not received by the first reception unit 1122A, but is received by the second reception unit 1123A. Therefore, if the signal from the transmission and reception unit 1102 is received using the first reception unit 1122A, such reception is not affected by the transmitted signal of the transmission and reception unit 1101, thereby making it possible to perform the full-duplex communication.

In the case of State 2, the transmission unit 1121A of the transmission and reception unit 1101 transmits a light beam having a wavelength of about 900 nm. In this case, the transmitted light beam from the transmission and reception unit 1101 is received by the first reception unit 1122A, but is not received by the second reception unit 1123A. Therefore, if the signal from the transmission unit 1121B of the transmission and reception unit 1102 is received using the second reception unit 1123A, such reception is not affected by the transmitted signal of the transmission and reception unit 1101, thereby making it possible to perform the full-duplex communication.

In either of the two cases, the wavelength of the semiconductor laser chip to be used for transmission from the transmission and reception unit 1101 is determined in a short time by determining the wavelength of a signal light beam from the transmission unit 1121B of the transmission and reception unit 1102. If transmission is performed using the selected semiconductor laser chip, the full-duplex communication can be achieved. In Embodiment 5, the light receiving elements having characteristics depending on wavelengths are used. The semiconductor laser chips matching the characteristics are used. This leads to achievement of the full-duplex communication without a filter.

Embodiment 6

Figure 12:
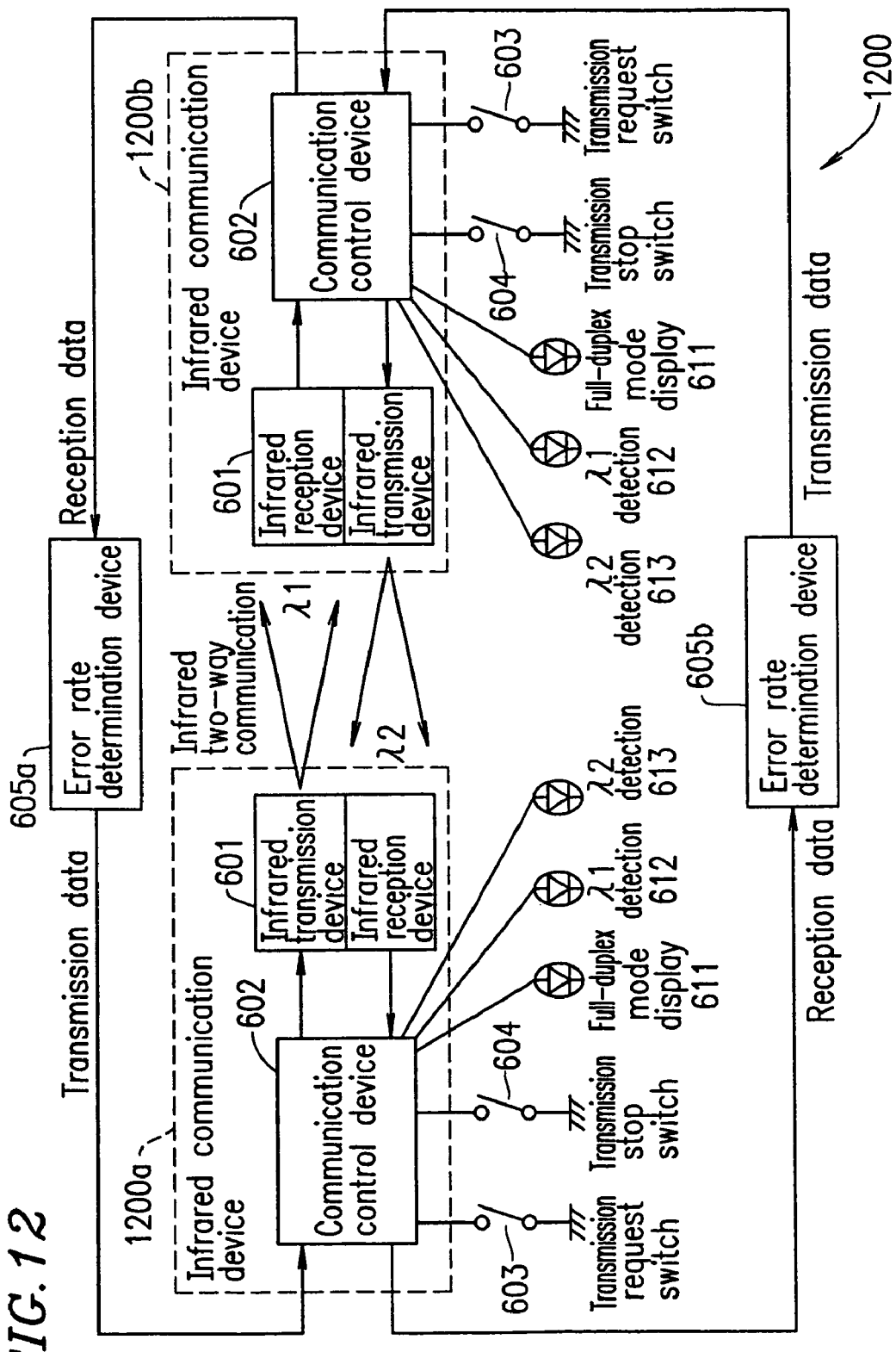
FIG. 12 is a diagram showing a two-way infrared communication experimental device according to Embodiment 6 of the present invention.

FIG. 12 shows an experimental device 1200 for measuring the error rates of two-way infrared communication devices 1200a and 1200b each including the semiconductor laser of the present invention as an infrared transmission and reception device 601 and the control device of the present invention as a communication control device 602.

The infrared transmission and reception device 601 is capable of selectively receiving a light beam having each wavelength. The communication control device 602 uses a microcomputer so as to achieve the above-described control functions for the experiment.

The infrared communication devices 1200a and 1200b each include a switch 603 for a transmission request and a switch 604 for a transmission stop request. The infrared communication devices 1200a and 1200b are placed opposing each other. When the switch 603 is turned ON, the communication protocol described in Embodiment 4 is conducted to establish the full-duplex communication path. An LED 611 is used to indicate that the communication path is in the full-duplex communication mode. An LED 612 is an indicator of signal detection of a light beam having a wavelength of $\lambda 1$. An LED 613 is an indicator of signal detection of a light beam having a wavelength of $\lambda 2$.

Error rate measurement devices 605a and 605b check the transmission states of the two-way infrared communication. In Embodiment 6, transmission data is transferred from the error rate measurement device 605a to the infrared communication device 1200a. The infrared transmission device of the infrared communication device 1200a transmits the data. The data is then received by the infrared reception device of the infrared communication device 1200b and input to the error rate measurement device 605a. The error rate measurement device 605a measures an error rate between the transmission data and the reception data. In contrast, transmission data is transferred from the error rate measurement device 605b to the infrared communication device 1200b. The infrared transmission device of the infrared communication device 1200b transmits the data. The data is then received by the infrared reception device of the infrared communication device 1200a and input to the error rate measurement device 605b. The error rate measurement device 605b measures an error rate between the transmission data and the reception data. Thus, the states of the two-way communication are monitored by the two error rate measurement devices, checking the transmission errors simultaneously in sending and receiving.

Using the experimental devices 1200, transmission was performed at a transmission rate of about 100 Mbps over a distance of about 2 m. The turning ON of the transmission request switch 603 started two-way transmission between the experimental devices 1200a and 1200b. The LED 611 stayed illuminated. An error meter indicated 0 errors. The communication was satisfactory.

The turning ON of the transmission stop switch 604 ended the bi-directional communication. It was confirmed that the full-duplex communication can be performed. In Embodiment 5, the experiment was conducted at about 100 Mbps. A higher speed transmission may be performed when a clock speed is increased.

Embodiment 7

In Embodiment 7, when the semiconductor laser chips are covered with the molded resin, the amounts of materials having different refractive indexes and mixed into the molded resin, the size or form of the molded resin, or the like are adjusted to obtain a light spot diameter of about 1 mm. POF having a core diameter of about 1 mm is used as a fiber. Direct coupling between the light beam and the POF is attempted. As a result, a highly efficient light coupling can be performed by visual observation without any special instrument. The spot size and radiation angle of the semiconductor laser device are freely adjusted, so that the semiconductor laser device can be designed in accordance with various applications.

In Embodiment 7, the amounts of materials having different refractive indexes and mixed into the molded resin, the size or form of the molded resin, or the like are adjusted to obtain a light spot diameter of about 1 mm. When any other spot size is required, the intervals between a plurality of semiconductor laser chips, the intervals between the light emitting portions of a multi-stripe laser, the width of the light emitting portion of a broad laser, or the like can be adjusted to obtain the desired spot size.

Embodiment 8

Figure 13:
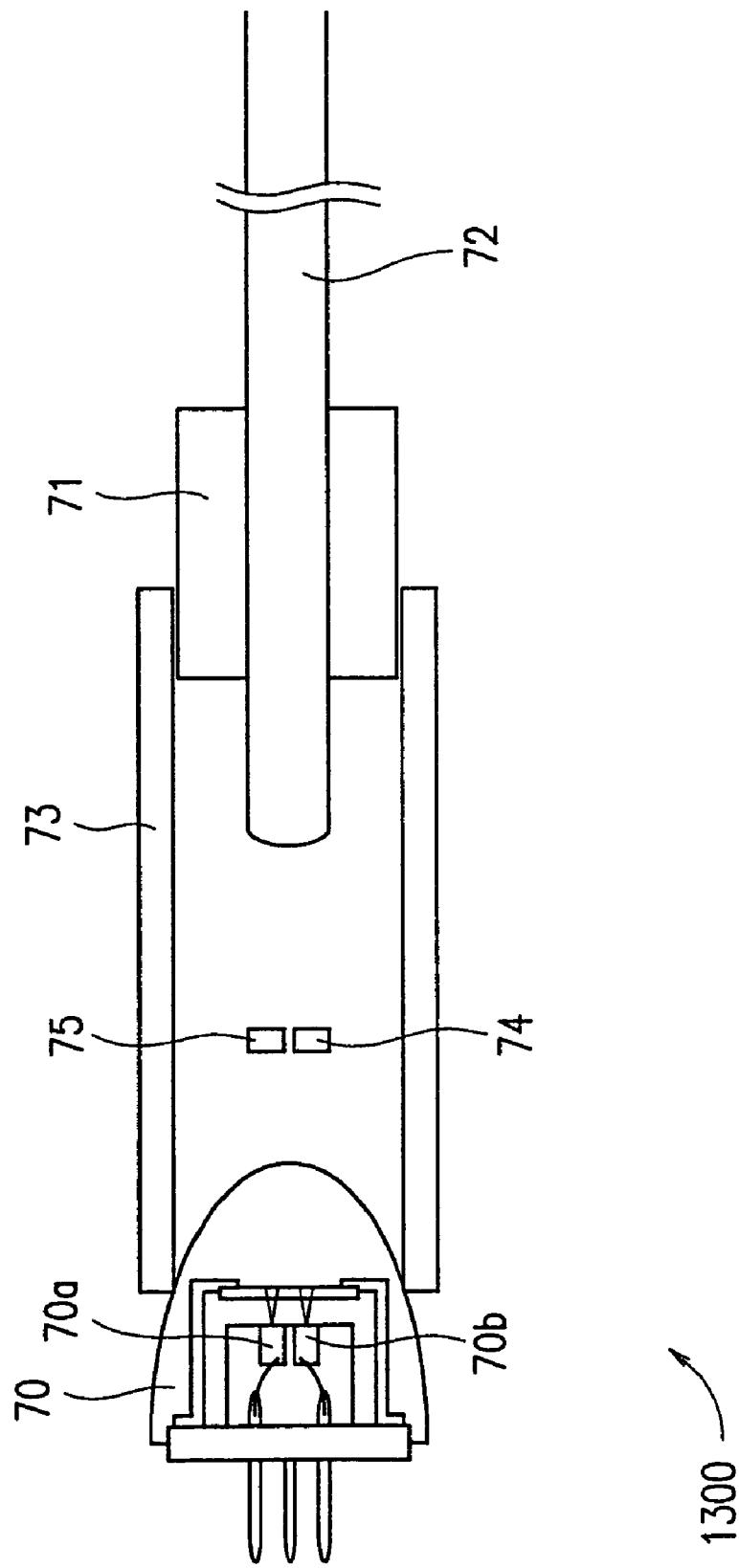
FIG. 13 is a cross-sectional view showing a fiber optical transmission unit according to Embodiment 8 of the present invention.

FIG. 13 is a cross-sectional view showing a fiber optical transmission unit 1300 according to Embodiment 8 of the present invention. The optical transmission unit 1300 uses a POF 72 as a fiber. An optical mini plug 71 is attached near the tip of the POF 72. The semiconductor laser device 70 includes a package including a semiconductor laser chip 70a for emitting a light beam having a wavelength of 780 nm and a semiconductor laser chip 70b for emitting a light beam having a wavelength of 980 nm. The package is covered with a molded resin such that the spot size of an emitted light beam is set to about 1 mm. The semiconductor laser device 70 is attached to an optical mini jack (OMJ) 73. A light receiving element 74 which selectively receives a light beam having a wavelength of about 780 nm and a light receiving element 75 which selectively receives a light beam having a wavelength of about 980 nm are provided within the OMJ 73. The OMJ 73 as a specific connector in Embodiment 8 will be described below. The light receiving elements 74 and 75 are attached to the optical path between the semiconductor laser device 70 and the POF 72. Part of a light beam emitted from the semiconductor laser device 70 is blocked by the light receiving elements 74 and 75, leaving the remainder of the light beam transmitted to the POF 72. Similarly, part of a light beam from the POF 72 is blocked by the light receiving elements 74 and 75, leaving the remainder of the light beam transmitted to the semiconductor laser device 70. However, the semiconductor laser chips 70a and 70b are shielded by the molded resin so that substantially no light returns to the semiconductor laser chips 70a and 70b. Substantially no noise due to the returning light is observed.

Transmission of image information was tested using the fiber optical transmission units of Embodiment 8. In this test, the protocol described in Embodiment 4 was used. It was confirmed that the full-duplex communication can be performed.

Embodiment 9

Figure 14:
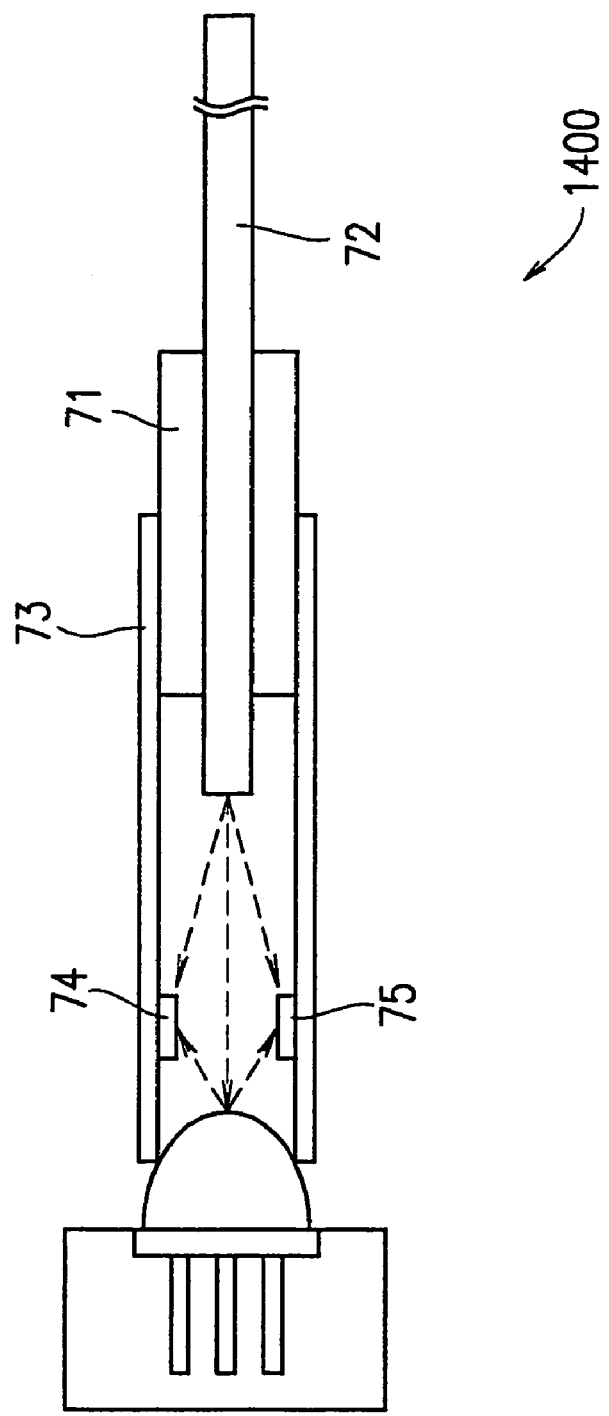
FIG. 14 is a cross-sectional view showing a fiber optical transmission unit according to Embodiment 9 of the present invention.
Figure 15:
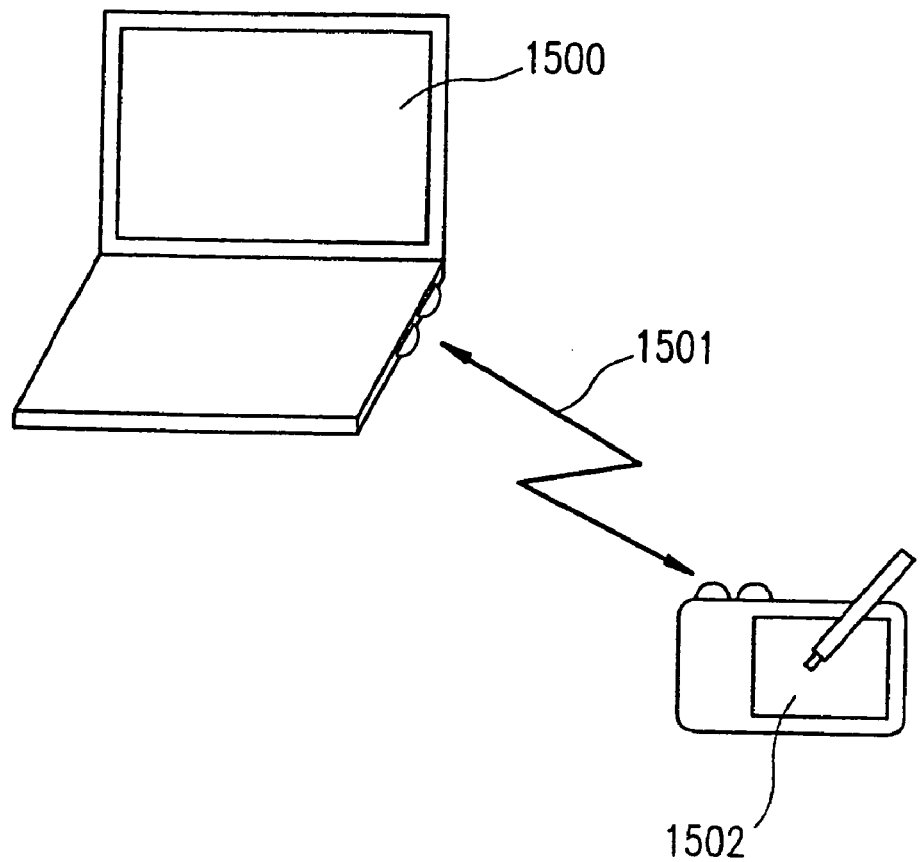
FIG. 15 is a diagram showing a conventional optical transmission system using infrared light.

FIG. 14 is a cross-sectional view of a fiber optical transmission unit 1400 according to Embodiment 9 of the present invention. Embodiment 9 differs from Embodiment 8 in the arrangement of the light receiving elements 74 and 75 within the OMJ 73. In Embodiment 9, the light receiving element 74 which selectively receives a light beam having a wavelength of about 780 nm and the light receiving element 75 which selectively receives a light beam having a wavelength of about 980 nm are attached on the inner surface of the OMJ 73. Therefore, a light beam emitted from the semiconductor laser device 70 and traveling straight is not blocked by the light receiving elements 74 and 75 before reaching the POF 72, resulting in highly efficient optical coupling. A light beam emitted from the POF 72 is diffracted into a given angle. The light receiving elements 74 and 75 on the inner surface of the wall can even receive a light beam whose intensity falls within the range of photosensitivity thereof. As a result, even when the light output of the semiconductor laser device is about 80% of that of Embodiment 8, optical transmission could be performed in a way similar to those in Embodiment 8.

Further, a transmission test of image information was tested where a service signal of a multi-channel cable television was transmitted by the optical transmission unit 1400 of Embodiment 9. It was demonstrated that the full-duplex communication could be satisfactorily performed with substantially no error where the transmission rate was about 1 Gbps and the transmission distance (the length of the fiber) is about 100 m. A similar result was obtained when the optical transmission unit 1400 was used for image signal transmission between audiovisual (AV) devices. It was confirmed that the present invention is suitable for the above-described signal transmission.

As described above, in the present invention, the semiconductor laser chip and the molded resin having a light diffusion capability are combined so that a light beam emitted from the semiconductor laser chip is safely released into a space, thereby making it possible to achieve high-speed transmission with low power consumption.

The use of the multi-stripe semiconductor laser having a plurality of light emitting portions, the broad stripe semiconductor laser including a light emitting portion having a width of about 7 μm or more, or a plurality of semiconductor laser chips dramatically improves the reliability of the semiconductor laser device. Further, in this case, the spot size and radiation angle of an emitted light beam can be easily controlled.

When materials having different refractive indexes are mixed into the molded resin, and the molded resin does not contact the semiconductor laser chip, the safety of eyes is sufficiently ensured. In particular, the thermal resistance of the container including the semiconductor laser chip is preferably about 150 deg/W or less, more preferably 100 deg/W or less.

If a plurality of light emitting portions of the semiconductor laser chip, or a plurality of semiconductor laser chips emit a light beam having the same wavelength band, the reliability of the semiconductor laser device can be improved. Further, if at least two of a plurality of light emitting portions of the semiconductor laser chip, or at least two of a plurality of semiconductor laser chips emit light beams having different wavelength bands, the full-duplex communication can be performed.

In particular, if a light beam having a wavelength band of about 760 nm or more and about 1.5 μm or less, optical transmission is satisfactory. Satisfactory optical transmission is obtained with the least noise if the wavelength band is in the vicinity of about 900 nm, about 1.1 μm, or about 1.4 μm.

Furthermore, if the light receiving element including the wavelength determination means is used, the full-duplex space optical transmission system can be achieved.

The wavelength of a light beam transmitted from the transmission and reception unit at the other party is automatically distinguished from a plurality of other light beams having different wavelengths. A wavelength other than the distinguished wavelength is selected and a light beam having such a wavelength is transmitted from the party on this side. Whereas the space optical transmission such as IrDA is conventionally half-duplex communication, the full-duplex space optical transmission can be realized in the present invention. Since the wavelength of a light beam to be used in transmission is not necessarily specified in advance, symmetrical communication can be realized without separation such as a main phone and a cordless handset. Even when the transmission and reception unit at the other party is changed, the setting of the wavelength selection is not required. The communication protocol which is conventionally complicated can be simplified. The present invention can be applicable to an IEEE1394 space optical transmission method.

When the transmission and reception unit transmits a light beam, the reception circuit thereof is controlled so that the reception circuit does not detect a light beam emitted by the light emitting element thereof. Therefore, the transmission and reception unit can perform reception without influence by its own signal, thereby ensuring a satisfactory communication state.

Further, conventionally, the dominating IEEE1394 full-duplex optical communication system uses two fibers. The system can be achieved using a single fiber. The optical coupling of the semiconductor laser device with the fiber can be easily performed.

The cylindrical connector is used to connect the light emitting device (semiconductor laser device) with the optical fiber. The light emitting device is placed at one end of the connector while the optical fiber is placed at the other end of the connector. The light receiving element is placed inside the cylindrical connector. The use of the connector makes it easier to connect the semiconductor laser device or the light emitting device with the fiber. Moreover, when the light emitting device is attached to the inner surface of the wall of the connector, a light beam emitted from the semiconductor laser device is not blocked by the light emitting element, thereby improving the utilization rate of a signal light beam to obtain the high efficiency of optical coupling.

According to the control device of the present invention, the wavelength of a light beam transmitted from a communication device of the other party is automatically distinguished from a plurality of other light beams having different wavelengths. A wavelength other than the distinguished wavelength is selected and a light beam having such a wavelength is transmitted from the party on this side.

According to the communication device of the present invention, even when the terminal at the other party is changed, the setting of wavelength selection is not necessarily required. The communication protocol which is conventionally complicated can be simplified. Further, data transmission and reception can be performed by the full-duplex communication. Furthermore, when a protocol, in which each party sets its own random waiting time, is used, connection collision can be avoided if transmission is simultaneously performed at a plurality of parties. Connection can be established in any situation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical transmission/reception device comprising:
  a plurality of semiconductor laser chips, each of the plurality of semiconductor laser chips capable of emitting a light beam having a specific wavelength, the wavelength of the light beam emitted from each of the plurality of semiconductor laser chips being different from one another, each of the plurality of semiconductor laser chips operating independently from one another; and
  a plurality of light receiving elements, each of the plurality of light receiving elements receiving a light beam of specific wavelength as that corresponding to one of the plurality of semiconductor laser chips, the plurality of semiconductor laser chips configured such that a wide band signal is split into a plurality of signals and simultaneously transmitted by the semiconductor laser chips, wherein the plurality of semiconductor laser chips include:
a cap encapsulating the plurality of semiconductor laser chips, the cap having a cap glass to pass light emitted from the plurality of semiconductor laser chips; and
a molded resin having a light diffusion capability, wherein the cap encapsulating the plurality of semiconductor laser chips is covered with the molded resin,
wherein the plurality of semiconductor laser chips are configured to emit light only having wavelengths of 900 nm, 1.1 µm and 1.4 µm.

2. An optical transmission/reception system including:
a plurality of transmission/reception devices according to claim 1.

3. An optical transmission/reception system according to claim 2, wherein among the plurality of optical transmission/reception devices, a light beam is transmitted via a space, or a light beam is transmitted via an optical fiber as a transmission path.

4. The optical transmission/reception device according to claim 1, wherein
said each of the plurality of light receiving elements includes:
a molded resin, each molded resin for said each of the plurality of light receiving elements transmitting a range of light beam wavelengths that is different from one another.

5. The optical transmission/reception device according to claim 1, wherein
said each of the plurality of light receiving elements includes:
a wavelength filter, each wavelength filter for said each of the plurality of light receiving elements transmitting a range of light beam wavelengths that is different from one another.

6. The optical transmission/reception device according to claim 5, wherein
a first light receiving element of said plurality of light receiving elements includes a first wavelength filter transmitting a range of light beam wavelength that is greater than or equal to a specific wavelength, and
a second light receiving element of said plurality of light receiving elements includes a second wavelength filter transmitting a range of light beam wavelengths that is less than or equal to the specific wavelength.

7. The optical transmission/reception device according to claim 5, wherein
at least one of the wavelength filters is a band pass filter.

8. The optical transmission/reception device according to claim 1, wherein
a wavelength range of a photosensitivity of each light receiving element is different from one another.

9. The optical transmission/reception device according to claim 8, wherein
a wavelength range of a photosensitivity of a first light receiving element of said plurality of light receiving elements is greater than or equal to a specific wavelength, and
a wavelength range of a photosensitivity of a second light receiving element of said plurality of light receiving elements is less than or equal to the specific wavelength.

10. An electronic device including:
an optical transmission/reception device according to claim 1.

* * * * *